United States Patent
Hurwitz et al.

(10) Patent No.: US 10,892,722 B2
(45) Date of Patent: Jan. 12, 2021

(54) METHOD OF AND APPARATUS FOR REDUCING THE INFLUENCE OF A COMMON MODE SIGNAL ON A DIFFERENTIAL SIGNAL AND TO SYSTEMS INCLUDING SUCH AN APPARATUS

(71) Applicant: Analog Devices International Unlimited Company, Limerick (IE)

(72) Inventors: Jonathan Ephraim David Hurwitz, Edinburgh (GB); George Redfield Spalding, Jr., Edinburgh (GB); Seyed Amir Ali Danesh, Edinburgh (GB)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 16/015,657

(22) Filed: Jun. 22, 2018

(65) Prior Publication Data

US 2019/0081601 A1 Mar. 14, 2019

Related U.S. Application Data

(60) Provisional application No. 62/555,979, filed on Sep. 8, 2017.

(51) Int. Cl.
*H03F 3/45* (2006.01)
*H03M 1/12* (2006.01)
(Continued)

(52) U.S. Cl.
CPC ......... *H03F 3/45708* (2013.01); *G01R 17/00* (2013.01); *H03F 3/45713* (2013.01);
(Continued)

(58) Field of Classification Search
CPC .................. H03F 3/45708; H03F 3/45713
(Continued)

(56) References Cited

U.S. PATENT DOCUMENTS 8,833,850 B2  9/2014  Suzuki et al.
9,151,818 B2  10/2015  Danesh
(Continued)

FOREIGN PATENT DOCUMENTS

EP   0482487      4/1992
WO   2007058932   5/2007
(Continued)

OTHER PUBLICATIONS

"International Application Serial No. PCT EP2018 074071, International Search Report dated Jan. 28, 2019", 6 pgs.
(Continued)

*Primary Examiner* — Tomi Skibinski
(74) *Attorney, Agent, or Firm* — Schwegman Lundberg & Woessner, P.A.

(57) ABSTRACT

Differential sampling circuits may be adversely affected by changes in common mode voltage. Changes in the common mode voltage may alter the on resistance of transistor switches which it turn may mean that small signal changes are not correctly observed against a bigger common mode signal. The present disclosure relates to a way of improving the ability to resolve small differential signal changes by varying the supply or drive voltage to a component to compensate for common mode voltage changes.

26 Claims, 20 Drawing Sheets

(51) Int. Cl.
*G01R 17/00* (2006.01)
*H03K 17/0812* (2006.01)
*H03K 17/30* (2006.01)
*H03K 17/56* (2006.01)
*H03M 1/46* (2006.01)
*H04B 1/04* (2006.01)
*G01L 9/02* (2006.01)
*G01R 19/00* (2006.01)

(52) U.S. Cl.
CPC ..... *H03K 17/08122* (2013.01); *H03K 17/302* (2013.01); *H03K 17/56* (2013.01); *H03M 1/124* (2013.01); *H03M 1/1295* (2013.01); *H03M 1/466* (2013.01); *H04B 1/04* (2013.01); *G01L 9/02* (2013.01); *G01R 19/0084* (2013.01); *H03F 2203/45401* (2013.01)

(58) Field of Classification Search
USPC .............................................. 327/91–96, 390
See application file for complete search history.

(56) References Cited

U.S. PATENT DOCUMENTS

| | | | |
|---|---|---|---|
| 2003/0151430 A1* | 8/2003 | Hakkarainen | H03M 1/165 327/94 |
| 2006/0156042 A1* | 7/2006 | Desai | G06F 1/28 713/300 |
| 2007/0164723 A1 | 7/2007 | Yanagisawa | |
| 2014/0077860 A1 | 3/2014 | Shu | |
| 2014/0232579 A1* | 8/2014 | Kabir | H03M 1/002 341/143 |
| 2014/0191776 A1 | 12/2014 | Danesh et al. | |
| 2015/0244393 A1* | 8/2015 | Kabir | H03M 3/488 341/143 |
| 2016/0209287 A1 | 7/2016 | Hirayama | |
| 2017/0045407 A1 | 2/2017 | Nishikawa et al. | |

FOREIGN PATENT DOCUMENTS

| | | |
|---|---|---|
| WO | WO-2013038176 A2 | 3/2013 |
| WO | WO-2014072733 A2 | 5/2014 |
| WO | WO-2019048579 A1 | 3/2019 |

OTHER PUBLICATIONS

"International Application Serial No. PCT EP2018 074071, Written Opinion dated Jan. 28, 2019", 10 pgs.

* cited by examiner

METHOD OF AND APPARATUS FOR REDUCING THE INFLUENCE OF A COMMON MODE SIGNAL ON A DIFFERENTIAL SIGNAL AND TO SYSTEMS INCLUDING SUCH AN APPARATUS

CLAIM OF PRIORITY

This Application claims the benefit of priority to GB Patent Application No. 1801910.9, filed Sep. 8, 2017 and U.S. Provisional Patent Application No. 62/555,979, filed Sep. 8, 2017, which are hereby incorporated by reference in their entirety.

FIELD

The present disclosure relates to a method of and apparatus for reducing unwanted conversion of a common mode signal variation into artefacts that perturb the measurement of a differential signal. The change in common mode voltage may be deliberate, for example as a result of an excitation applied to a circuit adapted to measure a physical or electrical parameter.

BACKGROUND

Circuits, for example measurement circuits for measuring an electrical or physical property, may be subjected to varying input voltages. It is advantageous that the circuit responds in a predictable way to such input voltages, and that a response of a signal processing apparatus connected to the circuit does not impact adversely on the changes in differential voltages output from the circuit as a result of changes in a common mode voltage within or at outputs of the circuit.

SUMMARY OF THE DISCLOSURE

According to the present disclosure there is provided an apparatus comprising an active circuit for adjusting a control voltage of at least one transistor switch or a supply voltage of a differential signal processing circuit as a function of a known stimulation signal applied to a first circuit that provides a signal that is switched by the transistor switch or processed by the signal processing circuit.

The supply voltage may be one or more of a positive supply rail of the differential signal processing circuit, a negative supply rail of the differential signal processing circuit, and a ground node of the differential signal processing circuit.

The signal processing circuit may, for example, comprise an analog to digital converter. The signal processing circuit may comprise a differential amplifier. The differential amplifier may be a switched capacitor amplifier.

In an embodiment of this disclosure there is provided a signal processing circuit comprising a differential analog signal input stage having first and second input nodes for receiving first and second voltages of a differential signal, and control circuit responsive to the first and second voltages for modifying first and second supply voltages of the signal processing circuit as a function of the first and second voltages of the differential signal.

Preferably the control circuit modifies the first and second supply voltages as a function of a change in a common mode value of the first and second voltages of the differential signal. The change in the common mode value may result from the application of a stimulus signal to a circuit supplying the first and second voltages to the signal processing circuit. Alternatively the control circuit may be arranged to modify the first and second supply voltages as a function of a common mode value of the first and second voltages of the differential signal.

According to a further aspect of this disclosure there is provided an apparatus comprising a differential signal processing circuit and a stimulus signal generator, wherein the stimulus signal generator is arranged to apply a stimulus signal to an input circuit that is arranged to supply first and second signals that together form a differential signal to signal inputs of the differential signal processing circuit; and wherein the apparatus further comprises a further circuit responsive to the stimulus signal or to a control signal that is correlated with changes in the stimulus signal, and where the further circuit is arranged to cause a change in at least one of:
   a) a control voltage used to control the status of a transistor switch;
   b) a change in a supply voltage of a power supply to at least part of the signal processing circuit; and
   c) a change in a reference voltage or signal ground voltage of the signal processing circuit.

According to a further aspect of this disclosure there is provided a method of improving the common mode rejection ratio of a differential circuit, the method comprising varying first and second supply voltages of the differential circuit as a function of the common mode value of a differential input signal, and/or varying a nominally digital control signal applied to a gate of a field effect transistor acting as a switch or varying a back gate voltage of a field effect transistor acting as a switch as a function of the common mode value of the differential input signal.

According to a further aspect of the present disclosure there is provided a non-contacting voltage measuring apparatus comprising:
   a probe for capacitively coupling with a conductor at a voltage which is to be measured;
   a measurement capacitor which has first and second nodes, and which couples at the first node thereof with the probe to form a capacitive potential divider;
   a reference signal generator coupled to the second node of the measurement capacitor, and a measurement circuit coupled to the first and second nodes to measure a voltage across the measurement capacitor;
wherein the measurement circuit outputs a signal at a different frequency to the voltage which is to be measured.

The non-contacting probe may be a clamp-on or similar probe which can be placed adjacent or around the current carrying conductor. The probe effectively couples to the conductor by a first capacitance, this can be regarded as being formed of one plate being the surface of the conductor, a second plate being formed by the conducting material of the probe and an insulator between the plates being formed of the insulator around the conductor and the/or insulating material of the probe or an air gap. The probe is connected in series with another capacitor, herein referred to as a measurement capacitor, which advantageously is of a known value or whose value is determinable, or the transfer function of the capacitive potential divider is determinable. Properties of the measurement capacitor can be varied in a time varying manner. A simple property to vary is the voltage at one node of the measurement capacitor. Further properties include varying the capacitance of the measurement capacitor itself between two or more known values.

In an embodiment the non-contacting voltage measuring apparatus includes a circuit formed in accordance with the teachings of the first aspect of this disclosure.

BRIEF DESCRIPTION OF THE DRAWINGS

Embodiments of the present disclosure will be described, by way of non-limiting example only, with reference to the accompanying Figures, in which.

DESCRIPTION OF SOME EMBODIMENTS OF THE DISCLOSURE

It is highly desirable to be able to receive a signal from a sensor and amplify and/or filter the signal from the sensor. It is well known to use a differential amplifier in such circuits so as to increase the ability of the circuit to reject spurious signals, e.g. common mode noise.

Figure 1:
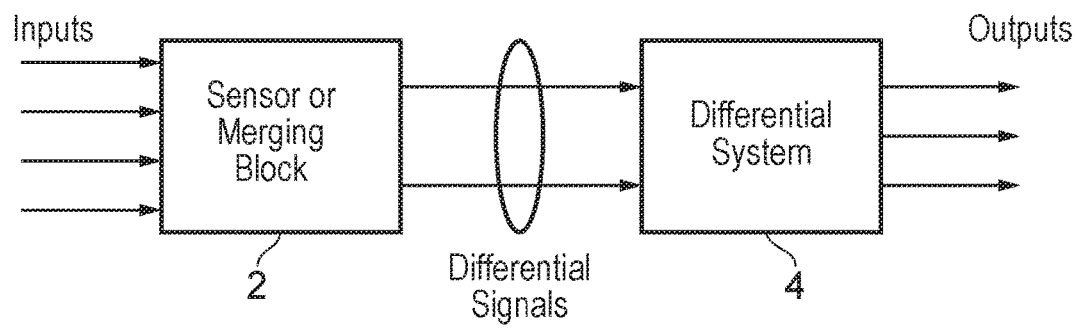
FIG. 1 is a circuit diagram of a generic sensor or other signal providing block in combination with a differential signal processing system.
Figure 2:
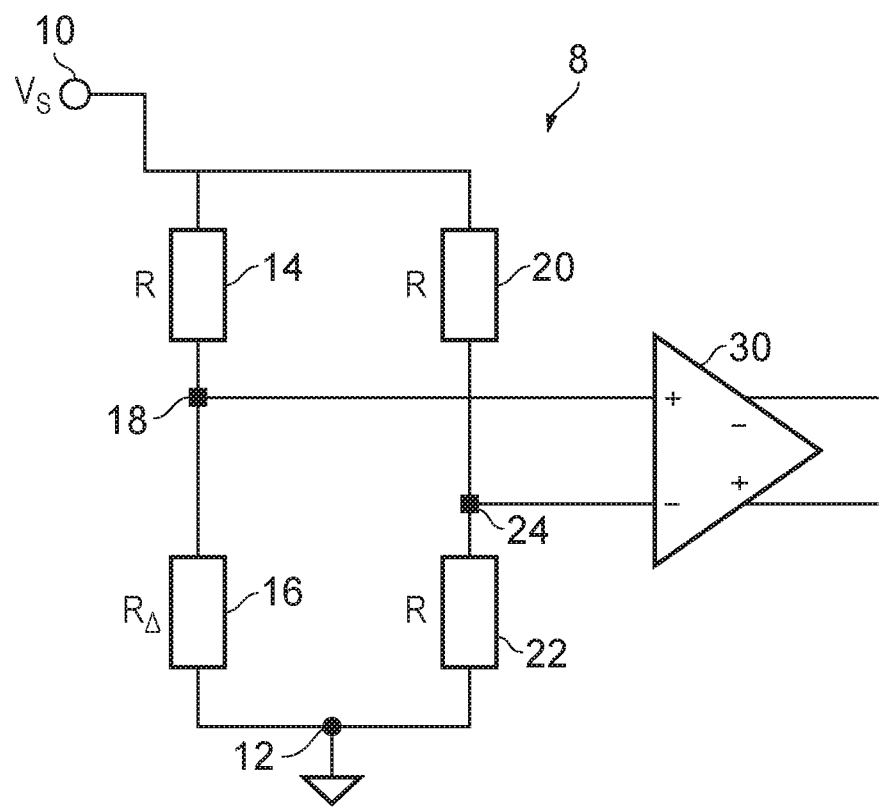
FIG. 2 is a circuit diagram of a sensor circuit formed around a Wheatstone bridge.
Figure 3:
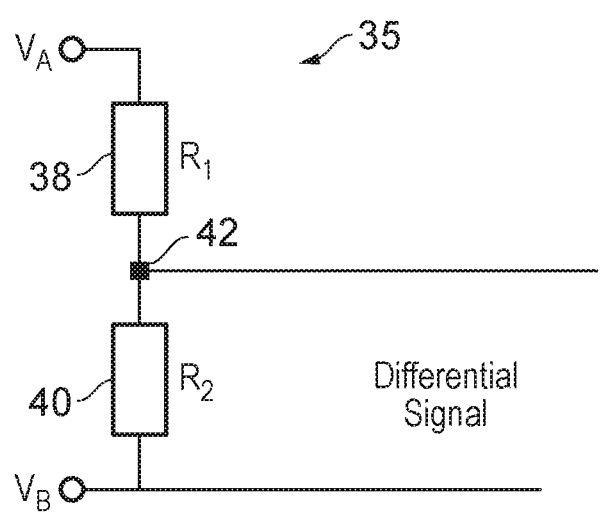
FIG. 3 is a circuit diagram of a sensor circuit formed around a potential divider.

Consider, for example, a combination of a sensor 2 and differential signal processing system 4 as shown in FIG. 1. The sensor 2 may be based on many types of circuit configuration, common examples of which include Wheatstone Bridges (as shown in FIG. 2) and potential dividers (as shown in FIG. 3). In FIG. 1 the sensor 2 has several arrows pointing into it. These represent inputs that affect the output of the sensor. Inputs include electrical signals to energize the sensor, and the common mode output voltage and differential response of the sensor may vary as a function of the input signals (which may be one or more voltages or currents) that energize it. Some sensors only measure a parameter of one of the input voltages supplied to it whereas other sensors may output one or more signals as a function of two (or more) input voltages or currents. Other sensors may measure physical parameters such as pressure, strain, fluid flow rates or strength and direction of magnetic fields. Consequently the inputs to the sensor 2 are potentially both electrical and wanted physical parameters. Unwanted physical parameters, such as changes in temperature may also affect the sensor or supply voltage fluctuations which might also affect the sensor. In the example shown in FIG. 1, the sensor 2 outputs differential signals to the differential signal processing system 4.

For completeness a Wheatstone bridge is schematically illustrated in FIG. 2. The Wheatstone Bridge 8 is connected between two voltage supply nodes 10 and 12. In this example node 10 is supplied with a voltage Vs and node 12 is a ground node. First and second impedances 14 and 16 are connected in series between nodes 10 and 12, and define a first intermediate node 18. A second set of series connected impedances 20 and 22 are connected between nodes 10 and 12 and define second intermediate node 24. The nodes 18 and 24 represent outputs of the Wheatstone bridge 8 which are connected to a differential amplifier 30. The Wheatstone bridge can be driven with DC or AC voltages. Suppose the bridge 8 is driven with a DC voltage Vs and all of the impedances are resistive with a value R. The voltage at nodes 18 and 24 should be Vs/2 and the differential voltage output by the amplifier 30 will be zero. If the impedance 16 undergoes a small change in value ΔR such that the impedance becomes $R_A$ where $R_A$=R+ER, then the voltage at node 18 changes slightly by ΔV, and the amplifier 30 gives a differential output. In this DC case the common mode voltage output from the Wheatstone bridge barely changes at all.

If the Wheatstone bridge is energized by a AC signal, then the effects of DC offset in the amplifier 30 can be simplified, but at the expense of having substantial variations in the common mode voltage output by the Bridge 8. The Wheatstone bridge can include components other than resistors, such as capacitors, inductors and semiconducting components.

FIG. 3 shows a potential divider 35, which really is half of a Wheatstone bridge. It comprises two impedances, in this case resistors 38 and 40 of value R1 and R2 connected in series between nodes at voltages $V_A$ and $V_B$. The difference $V_A$-$V_B$ is divided by the ratio R2/(R1+R2). A differential output signal is developed across R2. If either $V_A$ or $V_B$ varies, then the common mode value of the differential signal also varies.

Often a potential divider is used to measure voltage difference between the voltage $V_A$ at one end of the potential divider compared to the voltage $V_B$ at the other end of the potential divider in circumstances where the voltage difference may be, or is known to be, beyond the operating range of the subsequent signal processing circuits. Divide ratios may be quite large such that voltages occurring in electricity distribution systems can be converted to voltages in the order of a few hundreds of millivolts. This requires the transfer ratio of the voltage divider and the subsequent signal processing circuits to be known to a desired accuracy. Often the accuracy is mandated by a customer or by a standards body. Accuracies of 0.1% are commonly mandated. Providing components which can be guaranteed to meet this specification over a long operating life, over wide temperature ranges and humid environments may necessitate starting with devices calibrated to higher accuracies than specified and require the use of materials chosen for low coefficients of temperature. These approaches often involve relatively expensive materials, more complex production processes and hence more expensive production processes) and calibration steps. Ways to mitigate these problems are known and will be discussed later. There are many other uses for potential dividers other than in electricity meters. For example they find use in energy storage and battery management systems, in safety systems such as circuit breakers, in motor controllers and a whole host of monitoring and control applications in industrial, medical, aerospace, maritime, automotive and other environments. Potential dividers can be made using components other than resistors, such as capacitors, inductors and semiconducting components.

Figure 4:
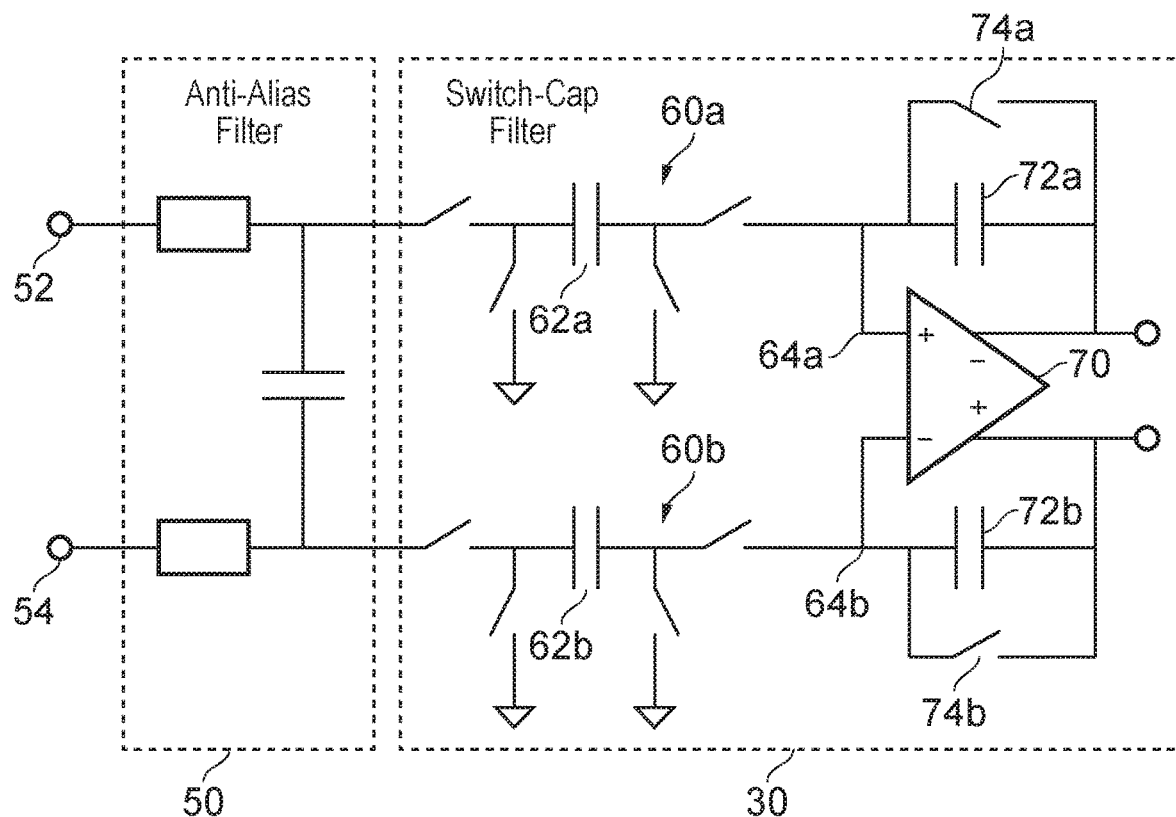
FIG. 4 is a schematic diagram of a switched capacitor differential amplifier.

FIG. 4 schematically illustrates an example of an amplifier that may be used to process the signals from the sensor circuit 2. In this example the amplifier 30 is implemented as a switched capacitor device, as this technology sits well with systems where a switched capacitor Analog to Digital converter (ADC) is used to digitize the input signal. The amplifier 30 is connected to an antialiasing filter 50 in order to attenuate signals above a filter cut off frequency such that there is little significant energy in signal components approaching half of the switching frequency of the amplifier 30. The amplifier, being a differential device, has two input sampling arrangements 60a and 60b, each comprising a sampling capacitor 62a and 62b in association with a respective switch network such that the capacitor 62a can connected to the input node 52 by way of the filter 50 during a sample phase to acquire the input voltage of node 52. The capacitor 62a can then be placed in a hold phase where it is disconnected from the input node 52 and from an associated node 64a of an operational amplifier 70. The capacitor may then be connected to the node 64a such that it undergoes charge exchange with a feedback capacitor 72a of the amplifier 70. Finally the capacitor 62a may optionally be reset by connecting both its plates together, or to a voltage such as ground. The feedback capacitor may also be reset during this phase by an associated shorting switch 74a. Similar components exist for the other input channel (and are designated by a "b" suffix in FIG. 4) and are operated in the same way. There are many other input sampling configurations known to the person skilled in the art that charge and discharge one or more capacitors in one or more phases, and the teachings of this disclosure are equally applicable to the other sampling configurations.

However common mode voltage changes can give rise to changes in the switch resistances, which can give rise to common mode voltage dependent time constants within the signal processing system. This can be undesirable, especially when looking for small voltage changes against a large background or excitation signal, where the time for a RC filter to charge to an appropriate level to observe the wanted change against the background signal such as a common mode voltage signal may be many time constants, as will now be discussed.

Suppose a capacitor of value C is to be charged from a discharged initial condition via a resistor of resistance R connected to an input voltage Vs. The instantaneous voltage V(t) across the capacitor is given by:

$$V(t)=Vs(1-e^{-t/RC})$$

The voltage V(t) rises towards the "correct" value Vs in an exponential manner. The upshot of this response it that if one wishes to measure a signal and the signal is acquired by a sampling circuit having an RC time constant, one must wait at least seven times the time constant for V(t) to rise to within 0.1% of Vs. Waiting eight times the RC time constant delivers 0.04% accuracy. If a fixed amount of waiting time is budgeted for the sample part of the sample and hold process, then a change in the time constant changes the amount by which V(t) has approached Vs. This is only one example of a way in which changes in the common mode voltage can affect the operation of the differential signal processing circuit. Additionally the impedance of the transistor switches can also interact with the components of the anti-aliasing filter.

Figure 5:
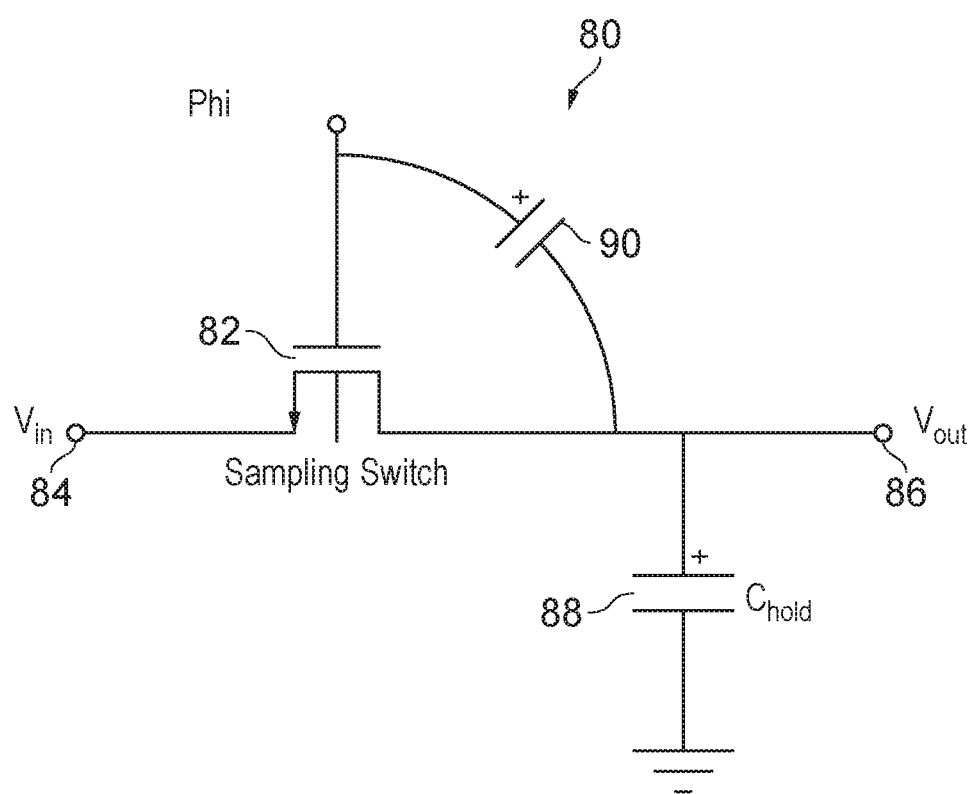
FIG. 5 is a schematic diagram of a sample and hold circuit comprising a sampling switch in association with a sampling capacitor.

To see how these resistance changes occur, consider for example a track and hold circuit as shown in FIG. 5. The circuit comprises a Field effect transistor 82, which in this example is an NMOS device, having its source connected to an input node 84 at which an input voltage Vin exists. A drain of the transistor 82 is connected to an output node 86 and to a sampling capacitor 88 having a value $C_{hold}$. The switching operation of the circuit is primarily controlled by a clock signal Phi. When Phi is high, transistor 82 is conducting and the voltage Vin at the input node 84 causes charge to be stored on the capacitor $C_{hold}$.

When Phi goes low, the transistor 82 becomes high resistance, and the charge is held stored on the capacitor 88. However this simple operation requires further analysis. In use the transistor 82 exhibits an on resistance, Rds-on. When a MOSFET is driven as a switch the gate voltage is usually driven to either supply rail so as to switch the device hard on or hard off. If the input voltage approaches the positive rail voltage Vdd, then the difference between Phi (when asserted) and Vin may not be sufficient to switch the transistor on properly. This gives rise to a change in the ON resistance Rds-on which varies as a function of the input voltage. In some designs this is addressed by voltage doubling the clock signal, whereas in other designs, often known as transmission gates, a PMOS transistor is placed in parallel with the NMOS transistor 82 and is driven with an inverted gate signal. As a result if the input voltage becomes so high that the NMOS device does not switch on, it can be guaranteed that the PMOS device is on. This however does not guarantee that the effective on resistance does not vary with Vin.

Just considering the simple arrangement shows in FIG. 5, when in the "on" state, the drain-source voltage is generally small. Under these conditions the on state resistance $R_{DS}$ can be approximated as:

$$R_{DS}=1/(Kn(V_{GS}-V_t))$$

Where
$V_{GS}$ is the gate-source voltage
$V_t$ is the device threshold voltage
Kn is a device coefficient, more specifically $Kn=\mu_n C_{ox}$ (W/L), where $\mu_n$ is the charge carrier mobility, $C_{ox}$ is the gate oxide capacitance per unit area, W is the gate width and L is the gate length. This ignores issues such as body effect which changes the threshold voltage.

An equation for the threshold voltage $V_T$ of a FET can be found in "Principles of Semiconductor Devices", by Bart Van Zeghbroeck at section 7.4.1 and which is available at https://ecee.colorado.edu/~bart/book/book/contents.htm.

$$V_T=V_{FB}+\gamma[\sqrt{2\varnothing_f+V_{SB}}-\sqrt{2\varnothing_f}]$$

Where:
$V_{FB}$ is the flat band voltage $$\phi_f = \frac{kT}{q} \ln\left(\frac{N_A}{n_i}\right)$$

$N_A$ is the dopant concentration
$n_i$ is the electron concentration in undoped semiconductor
$\varepsilon_{Si}$ is the permittivity of the semiconductor material (often silicon
q is the charge of an electron
T is temperature in Kelvin, and
B is Boltzmann's constant However it is to be noted that the equations for Vt includes a term $V_{SB}$ which represents the voltage difference between the source of the FET and the body material of the device, which is generally connected to a "back gate" node.

The change in threshold due to an applied source bulk voltage can be expressed as $$V_T = \gamma\left[\sqrt{2\varnothing_f + V_{SB}} - \sqrt{2\varnothing_f}\right]$$

Where $\gamma = \dfrac{\sqrt{2qN_A\varepsilon_{si}}}{C_{ox}}$

It can be seen that the on resistance varies in relation to the input voltage Vin. It can also be seen that the transistor 82 and the capacitor 88 form a low pass filter during the sample or track mode. The time constant of the filter depends on the input voltage and this is undesirable. The variable resistance of the transistor 82 varies as a function on Vin and denoted as Ron(Vin) acts in conjunction with the value of the capacitor 88 to form a low pass filter having a cut-off frequency fc given by $$fc=1/(2\pi*Ron(Vin)*Chold)$$

As a consequence, signal components may fall either side of the filter cut off frequency depending on the instantaneous value of Vin. Furthermore as discussed earlier the time taken to charge the sampling capacitor to within a specified fraction of the actual input voltage may vary. It is also worth noting that parasitic capacitances, represented in FIG. 5 by capacitor 90, can also cause charge to be exchanged with the sampling capacitor when the drive signal Phi changes state. The size of the charge on the parasitic capacitance is also be modulated by the voltage difference between the source and gate of the transistor 82. There is a similar parasitic capacitance between the gate and the input (drain) of the switch.

Figure 6:
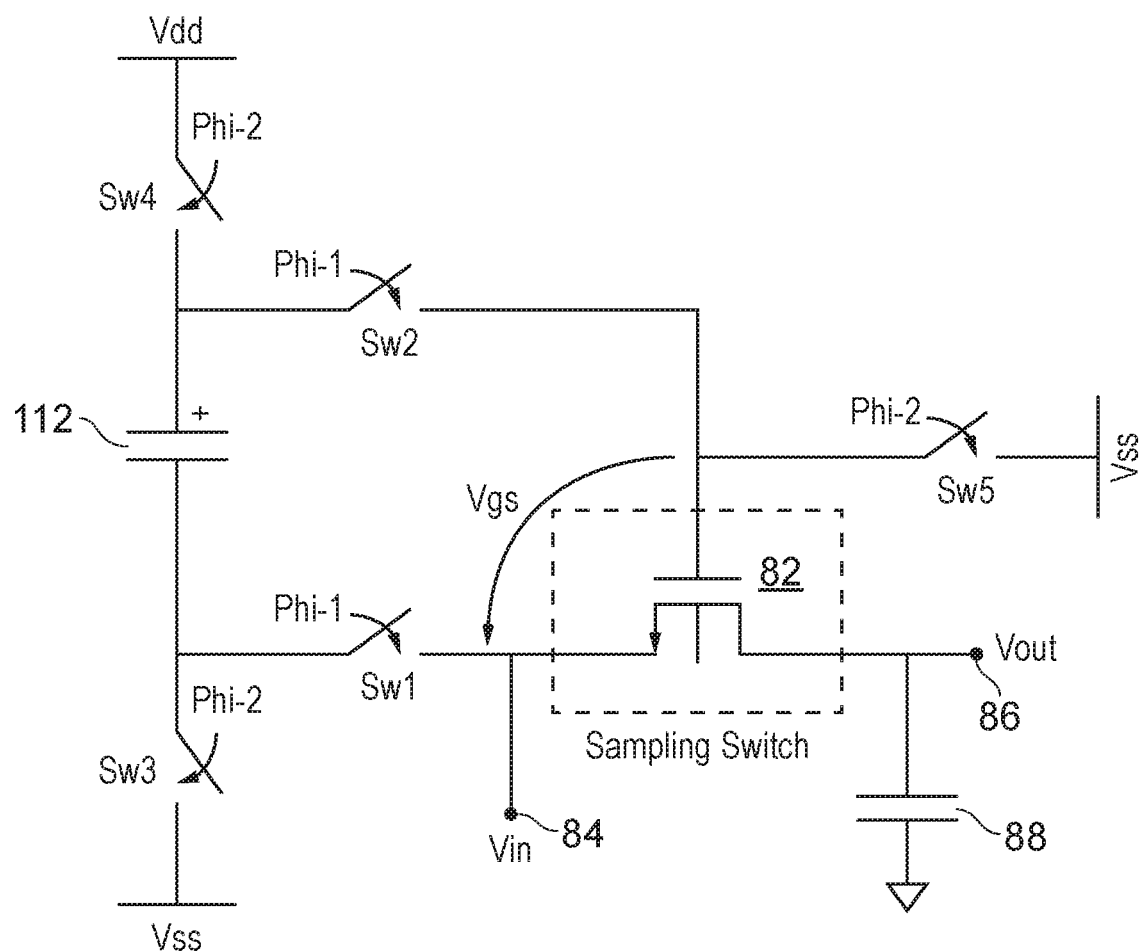
FIG. 6 is a circuit diagram of a known bootstrap circuit applied to the sample and hold circuit of FIG. 5 to improve operation of the sample and hold circuit.

Workers have sought to address this problem. One known approach to mitigate the problem of changes in the channel resistance as a function of input voltage Vin is to use of a bootstrap circuit as shown in FIG. 6. The bootstrap circuit includes additional transistor switches Sw1 to Sw5, and a bootstrap capacitor 112. Starting with phi-1 not asserted and Phi-2 asserted prior to switching the sampling switch 82 to conduct, the switches sw3 and sw4 are initially closed to charge the bootstrap capacitor 112 to Vdd. Then the clock signal Phi1 is asserted and phi2 un-asserted in a non-overlapping manner. Switches Sw1 and Sw2 close and all the other switches open. The lower plate of the bootstrap capacitor assumes the input voltage Vin. As a consequence, the gate voltage is always Vin+Vdd because of the voltage difference across the floating bootstrap capacitor.

This linearizes the switch 82 as its on resistance does not vary with the input voltage. A downside is that the input signal sees extra parasitic capacitance associated with the switches SW1, Sw2, Sw3 and Sw4 and that the size of the parasitic capacitance can vary with Vin as, for example, depletion region size within a device (e.g. the additional switches Sw1 and Sw2) changes in response to the voltage it sees. Also switching the bootstrap switches Sw1 to Sw5 can be a source of charge injection. Furthermore in an integrated circuit the provision of a bootstrap capacitor 112 uses up valuable space of the die and hence is a relatively costly solution, as generally capacitors are much bigger than transistors. These extra capacitors can result in an input current which can be signal dependent. Mismatch between the capacitors can also introduce voltage dependent artifacts in the signal processing chain such as offset and distortion.

It is desirable to improve on such an arrangement.

Figure 7:
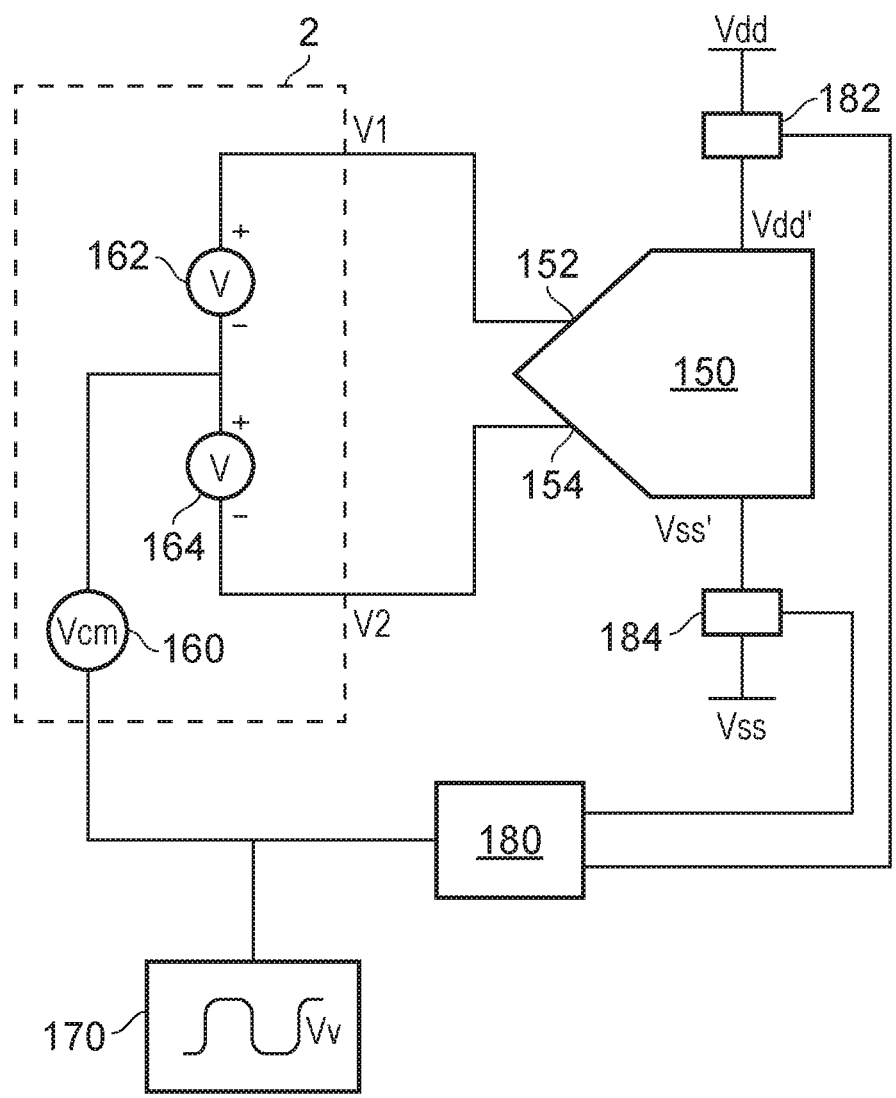
FIG. 7 schematically illustrates a differential signal processing circuit constituting an embodiment of the present disclosure.

FIG. 7 schematically illustrates a signal processing circuit comprising a differential Analog to Digital converter (ADC) in a circuit constituting an embodiment of the present disclosure. The differential analog to digital converter 150 can be a standard component implemented using any suitable technology. For the sake of this discussion the ADC 150 may be in the form of a sigma-delta converter with a switched capacitor input stage or a switched capacitor successive approximation converter such that it serves as its own sample and hold device. The ADC 150 receives first and second input voltages V1 and V2 at its first and second inputs 152 and 154 respectively from an input circuit 2 as previously discussed.

In general the first and second voltages V1 and V2 can be represented by a common mode component Vcm and a differential component Vdiff. This is represented in FIG. 7 by the provision of three voltage sources 160, 162 and 164.

The voltage source 160 generates the common mode voltage Vcm=(V1+V2)/2. The voltage source 162 generates a voltage V162 with a magnitude half the differential voltage Vdiff. The voltage source 164 generates a voltage V164 with the same magnitude but with opposite polarity to the voltage source 162. Hence we can write:

$$V162 = V164, \text{ and}$$

$$|V162| + |V164| = V\text{diff} = V1 - V2$$

It can be seen, conceptually that a movement in V1 and/or V2 has the potential to vary Vcm. Similarly even if the differential voltage remains unchanged, a change in Vcm varies the actual values of V1 and V2.

The sensor 2 may be actively arranged to receive a time varying stimulus Vstim from stimulus generator 170. Suppose the stimulus is a voltage varying between 0 and Vstim. Therefore in the arrangement shown in FIG. 7 the common mode value of V1 and V2 varies in time varying manner between Vcm and Vcm+Vstim.

This in turn means that the "on" resistance of the transistor switches in the input stage of the ADC 150 or of a circuit in the signal chain operating on the signals V1 and V2, such as a switched capacitor gain stage, change. These changes in impedance can give rise to changes in the measured differential voltage as a result of changes in the common mode voltage.

The inventors realized that rather than using bootstrap like circuits (with their disadvantages of size on a die and the risk that charge injection associated with the switches around the bootstrap capacitor could give rise to signal degradation that could be unacceptably large) that modulating the supply rails or control signals to all or part of the signal processing circuit, e.g. to the analog to digital converter 150 or to sampling switches thereof by a suitable amount could be used to mitigate the resistance changes resulting from variations in the common mode voltage resulting from a stimulus signal. The changes may be proportional to the change in common mode voltage. The suitable amount may be learnt or estimated based on knowledge of the characteristics of the input circuit 2 and knowledge of the size of the stimulus voltage Vstim. Thus the modulation of the supply rails or the control signals can include effectively shifting (voltage translating) the signals and/or scaling them.

The circuit shown in FIG. 7 includes two voltage regulators 182 and 184 which have a variable output voltage and which are responsive to control signals provided by a voltage correction signal generator 180. The first voltage regulator 182 is provided between the most positive supply rail Vdd and the positive supply input Vdd' of the analog to digital converter 150. The first voltage regulator 182 converts the nominally fixed Vdd voltage to a variable voltage Vdd' which is provided to the +ve supply input analog to digital converter 150. Similarly the second voltage regulator 184 is connected between the negative supply pin Vss' of the analog to digital converter 150 and the most negative (or least positive) supply rail Vss such that Vss' is variable under the control of the voltage correction signal generator 180. The nature of the stimulus could vary widely, it could be piece wise linear form, for example a square wave with or without slew rate limited transitions, a sine wave or something more complicated.

The regulators 182 and 184 may be implemented as linear circuits such as low drop out voltage regulators, for example as source followers possibly stabilized within a feedback loop of an operational amplifier. Alternatively switched mode regulators may be used, depending on choices such as power efficiency, power consumption and tolerance of noise from the switched mode supply.

Figure 8:
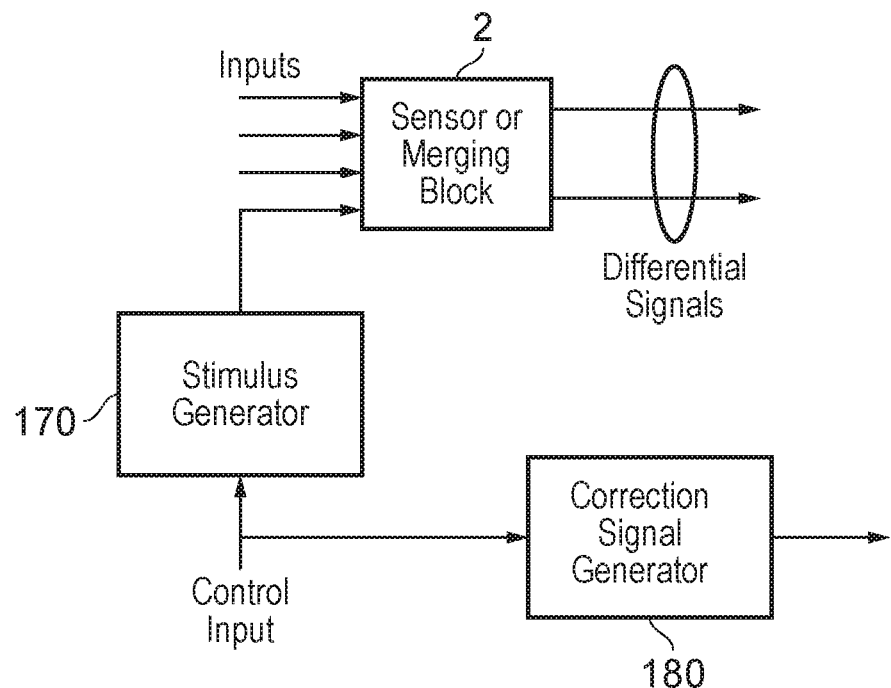
FIG. 8 illustrates an embodiment in which a correction signal works in an open loop manner in response to a control that is provided to the correction signal generator and to an excitation signal generator.

In use the correction signal generator 180 receives an indication of the status of the stimulus generator 170, either by monitoring the output of the voltage stimulus generator 170 or by being provided with a logic signal representing the status of the stimulus generator 170. These options are shown individually in FIGS. 8 and 9 in the context of FIG. 1. In the arrangement shown in FIG. 8 a control signal for the stimulus generator 170 is provided to the correction signal generator 180 for generation of a correction signal. Here the magnitude of the correction is generated in an open loop manner, i.e. from assumptions or prior knowledge about the signal output from the stimulus generator 170. The control inputs to the stimulus generator 170 and to the correction signal generator 180 do not need to be identical. The signals might have different assertion times, different length and/or in the case of multibit signals differing bit depths as long as objective of making the signal from the correction signal generator appropriate for the purpose of reducing the amount of unwanted differential signal change resulting from prevailing the common mode value of the stimulus.

Figure 9:
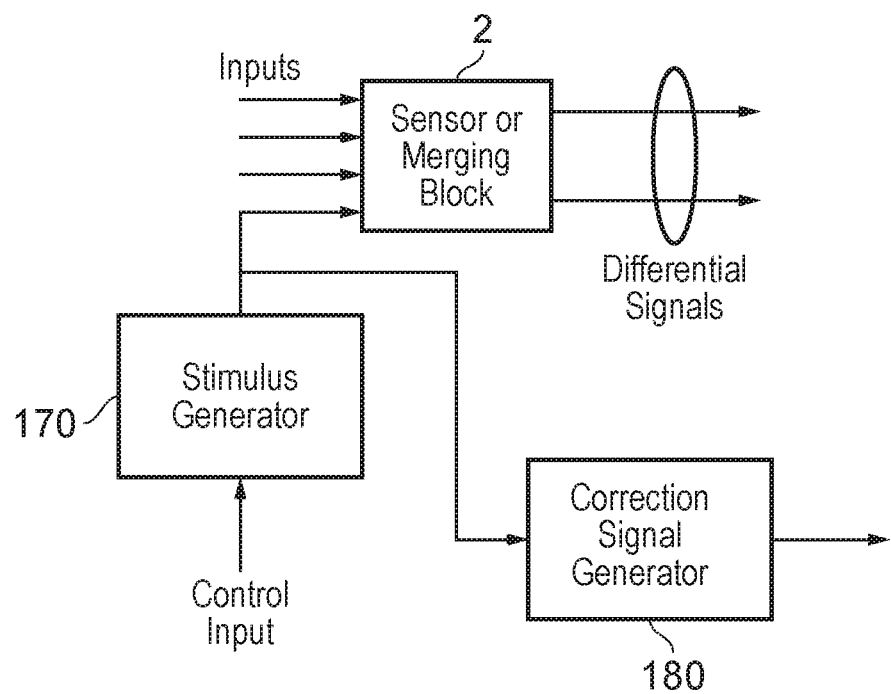
FIG. 9 illustrates an embodiment in which a correction signal works in a closed loop manner monitoring an output signal of an excitation signal generator.

In the arrangement shown in FIG. 9 the correction signal generator 180 monitors the output of the stimulus generator 170 and may use this signal to generate a correction signal. This approach has the potential to more accurately account for use of inexpensive stimulus generators which may have, for example, limited slew rates.

Figure 10:
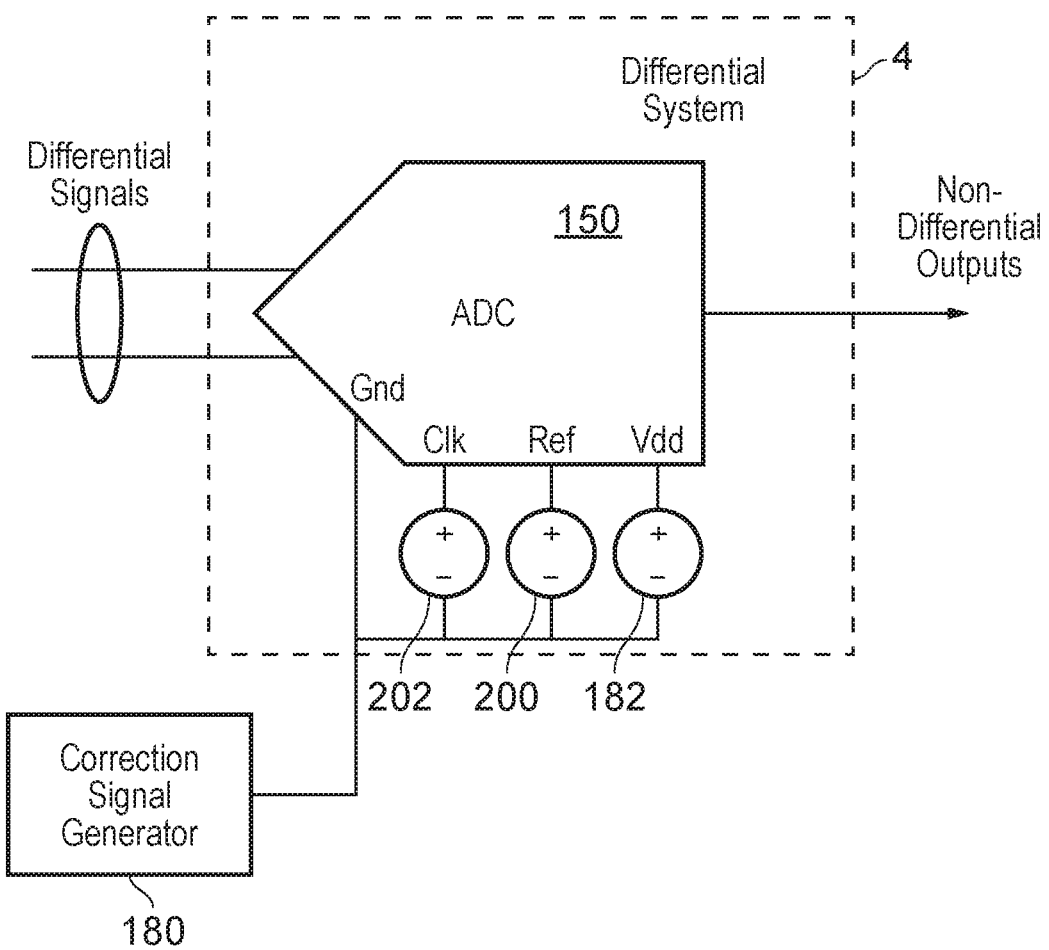
FIG. 10 illustrates an embodiment of the present disclosure where various voltages applied to an ADC are varied in response to the correction signal output by the correction signal generator.

FIG. 10 schematically shows a modification to the arrangement shown in FIG. 7. An output signal from the correction signal generator 180 is provided to the differential signal processing circuit 4, which is this example comprises ADC 150. The correction signal is provided to circuits 182, 200 and 202 to correct the supply voltage Vdd, a reference voltage and the clock voltage, respectively. The ground voltage may also be modified.

Figure 11:
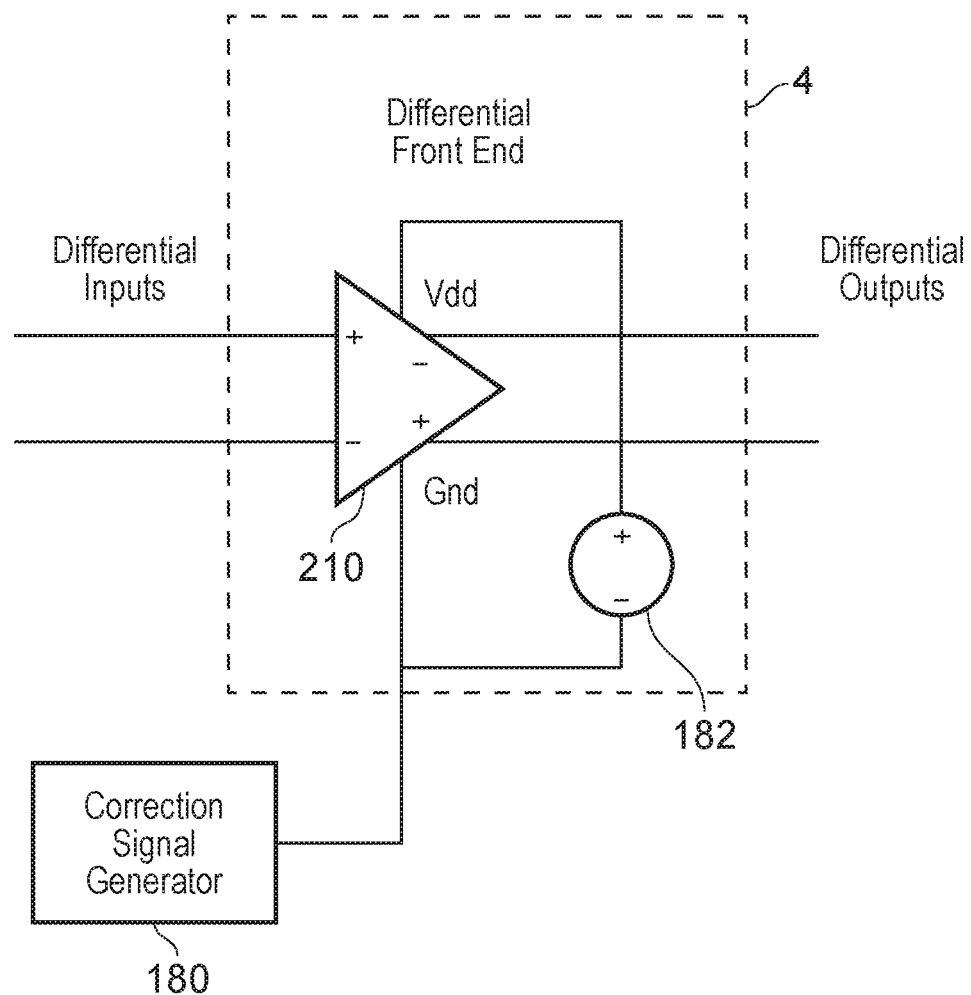
FIG. 11 illustrates an embodiment where a supply voltage to a differential circuit front end is modified in as a function of the correction signal output by the correction signal generator.

FIG. 11 shows how the correction signal from the correction signal generator may be used with a signal processing circuit 4 comprising a differential amplifier 210, here shown as a device having a dual ended output. Such an amplifier may be known as a difference amplifier. Here the amplifier 210 may not be a switched capacitor device so only the power supply rail voltages need to be modified by the circuit 182, and indeed such modification need only be applied to the input stage of the amplifier 210. If the amplifier was a switched capacitor device then the clock signals used to control the transistor switches may also be level shifted or modified. The power requirements of the transistors implementing the sampling switches within a differential amplifier configuration (which may be part of the analog to digital converter 150) are generally very modest. The inventors realized that in some cases this can be a very efficient way to implement the invention.

Figure 12:
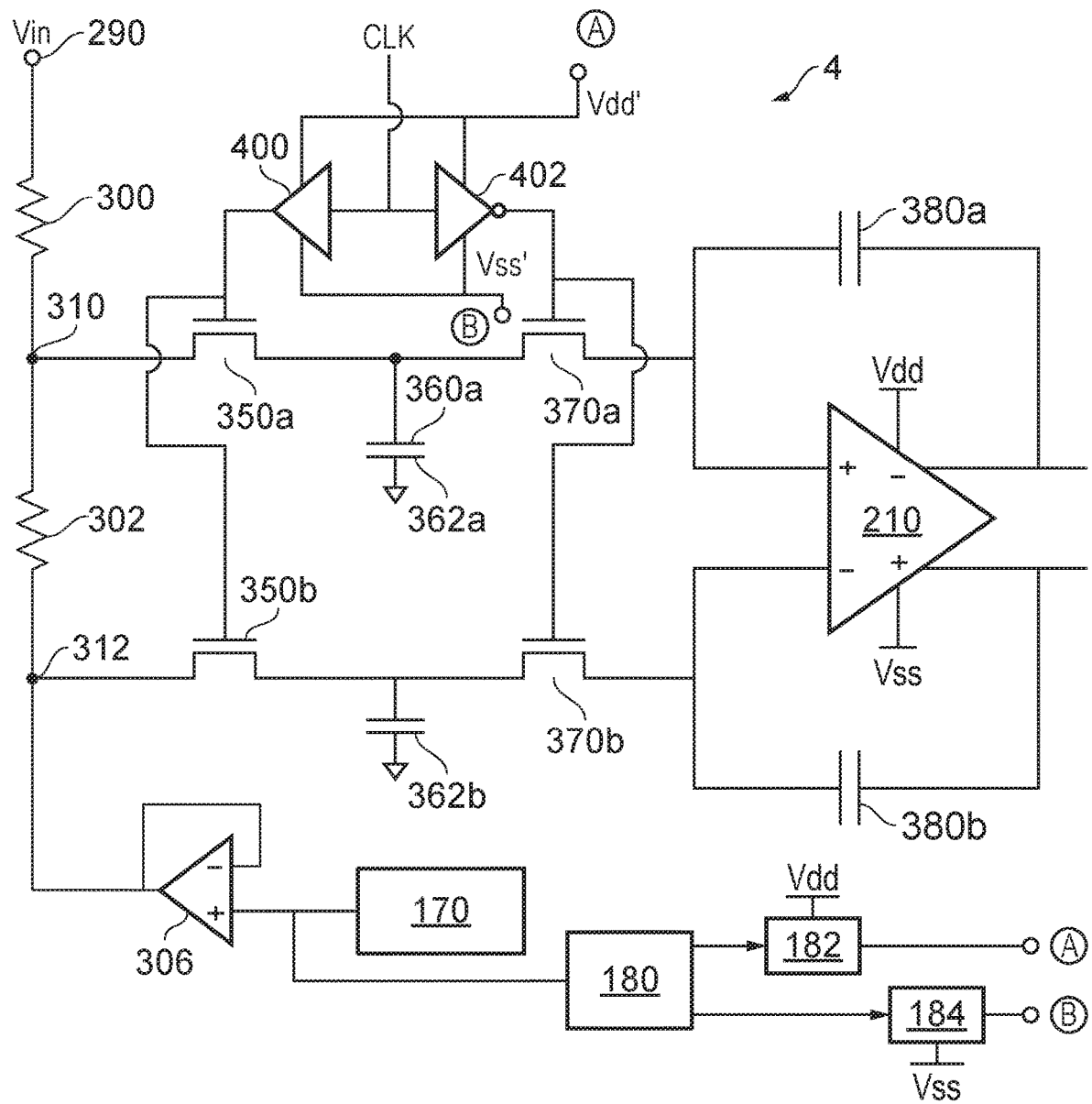
FIG. 12 illustrates an example embodiment where changes in supply voltage are used to modify a gate drive signal.

FIG. 12 shows a further embodiment of this disclosure, where a Voltage Vin at node 290 is being measured, for example as part of a metrology device such as a power consumption meter. Vin may be at several hundred volts RMS so may easily have a peak value in the 300V range. The input voltage may be input to a resistive potential divider comprised of resistors 300 and 302. Suppose that the resistors 300 and 302 have been set to make a potential divider with a nominal divide ratio of 1000 times. If the meter requires 0.2% accuracy then the resistor ratios have to be correct to within a ratio of 1 to 500000 times. Analog Devices Inc. has several proposals which simplify the constraints on the resistor accuracy by applying a known reference signal to the potential divider, and using the reference signal to characterize the transfer function of the potential divider and its signal processing chain. The reference signal can be supplied by a stimulus generator 170, and supplied to a node of the resistor 302 by way of a suitable buffer, such as an operational amplifier 306. The processing steps used to characterize the response of the potential divider (and indeed other sensors) and the signal processing chain are described in WO2014191776, WO2014072733, U.S. Pat. No. 9,151,818, WO2013038176, and U.S. Pat. No. 9,322,850. Briefly a known reference signal is passed through the measurement circuit. As will be shown, the measurement circuit has an effect on the reference signal, and a careful comparison of the effected reference signal with the original reference signal allows the transfer characteristic of the measurement signal to be estimated.

Suppose, just by way of explanation, that the divider has divide ratio of 1000 times, that Vin is 300V and that the reference signal at the output of the amplifier 306 varies between 0 V and 400 mV with respect to ground. When the reference signal is at 0V, then the voltage at an output node 310 of the potential divider is (300−0)/1000=0.3V with respect to ground. When the reference signal is 400 mV, then the voltage at node 310 is ((300−0.4)/1000)+0.4=0.6996V with respect to ground. In this instance we are looking for a differential voltage change of 0.0004V against a common mode voltage change of nearly 0.4V.

It can be seen that the potential divider has also acted on the reference signal such that its change in value is also attenuated by 1000 times, such that the wanted signal changes by 400 μV (micro-volts) even though it can also be seen that the voltage at node 310 has risen by nearly 400 mV. Furthermore if the voltage has to be measured to 0.1% accuracy or better, then the change in input voltage needs to be measured to 400 μV÷1000=400 nV accuracy. As a result an acquisition and signal processing circuit 4 connected to nodes 310 and 312 needs a common mode rejection ratio of 400 mV/400 nV or 120 dB or more to extract the wanted signal to sufficient accuracy from the common mode voltage change of around 400 mV. The change in the common mode signal is dominated by and highly correlated with the change in the stimulus signal. This means that errors due to the change in the common mode signal are likely to corrupt the scaled version of the reference signal (the stimulus signal) making the comparison between the scaled reference signal (which we wish to extract from the differential signal) and the original reference signal less reliable. This in turn reduces the accuracy of the estimation of the transfer function of the potential divider.

In accordance with an embodiment of the present disclosure the acquisition and processing circuit 4 is a differential circuit which has a sampling input in each channel, with one of the differential inputs being connected to node 310 and the other input being connected to node 312. Concentrating on only the channel connected to node 310, this comprises a first transistor switch 350a connected between node 310 and a first plate 360a of a sampling capacitor 362a. A second plate of the capacitor 362a is connected to a small signal ground. The first plate 360a is connected by way of a second transistor switch 370a to an input of a differential amplifier 210 which in this example is provided with feedback capacitors 380a and 380b such that it implements amplification by way of charge sharing between the sampling capacitors and the feedback capacitors. Shorting switches associated with the capacitors or circuits for adjusting the common mode output voltage have been omitted for simplicity but are known to the person skilled in the art. Similarly the anti-aliasing filter has been omitted for the purpose of si p lying the explanation, but may be assumed to be present.

The switches 350a and 370a are driven in antiphase by respective non-overlapping clock signals. However for simplicity is has been assumed that the requisite drive signals can be derived from a single clock signal CLK by way of suitable circuits represented here by a non-inverting buffer 400 receiving the signal CLK and driving the first switch 350a (and a corresponding switch 350b in the other input path) and an inverting buffer 402 receiving the clock signal CLK and driving the second switches 370a and 370b. It has been assumed that the switches are active when driven high, as would be the case with NMOS devices, but the person skilled in the art could use PMOS switches or a transmission gate architecture using parallel NMOS and PMOS devices each having a respective drive signal.

Each of the drivers, namely buffer 400 and inverter 402 is connected to the supply nodes Vdd' and Vss' as described with respect to FIG. 7 (the outputs of the voltage modification circuits 182 and 184, respectively). As a result the voltages applied to drive the switches (whether those voltages are applied to the gate terminal and/or to the back gate which controls the voltage of the substrate around the transistor switches) can be varied by the correction voltage generator 180 in response to changes in the common mode voltage.

In the arrangement shown in FIG. 12 the change in common mode voltage is known from the operation of the signal source and the nominal (or actual) divide ratio of the potential divider. As a consequence Vss' and Vdd' could be systematically changed in phase with the reference signal by an amount proportional to the reference signal, for example by 99.9% of the reference signal such that from the perspective of the switching transistors 180 and 190, there is an insignificant common mode voltage change during operation of the circuit with respect to the input signals.

As an alternative or additional approach, the correction signal, or a version of it, may be supplied to the back gate node of the transistors (the back gate being an intrinsic feature of a FET) such that the device threshold can be varied as a function of the gate voltage or the common mode voltage so as to manipulate the on state resistance of the FET acting as a switch.

Figure 13:
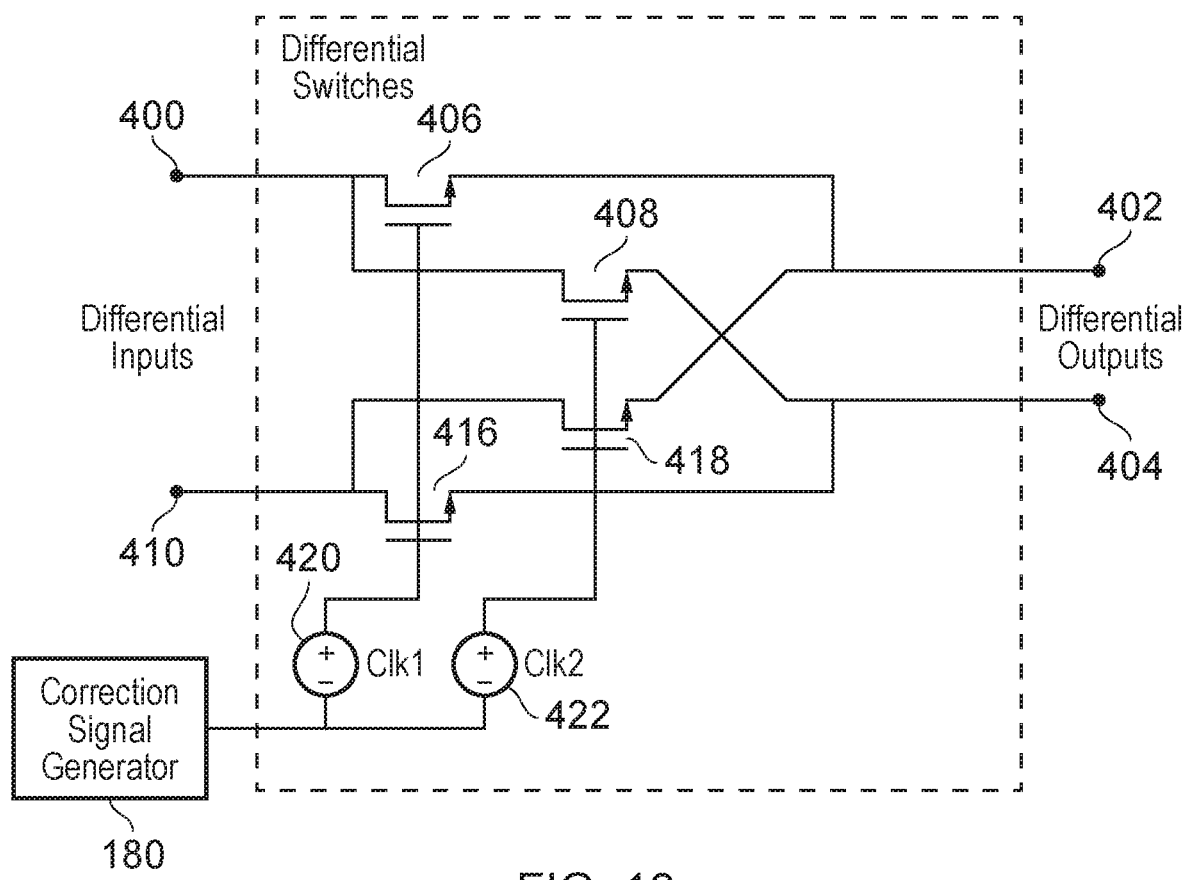
FIG. 13 illustrates an embodiment of a cross-over switch constituting an embodiment of this disclosure.

The approach of adjusting the clock signal voltage to follow changes in the common mode voltage resulting from the application of the stimulus signal may be applied to other switching circuits, such as chopping (cross-over) circuits used to route the differential signal in a straight through path or a swapped path to an amplifier for the purpose of removing input offsets within the amplifier. Such an arrangement is shown in FIG. 13.

Here a first input node 400 can be selectively connected to either a first output node 402 or to a second output node 402 by way of transistor switches 406 and 408, respectively. Similarly a second input node 410 can be connected to the output nodes 404 and 402 by transistor switches 416 and 418, respectively. The switches 406 and 416 are driven by a first clock voltage represented by voltage source 420. The switches 408 and 418 are driven by a second clock represented by voltage source 422. Both the voltage sources are referenced with respect to a correction signal output by the correction signal generator 180. The clock signals are non-overlapping (implementing a break before make switching function) and the second clock is inverted with respect to the first clock.

Figure 14:
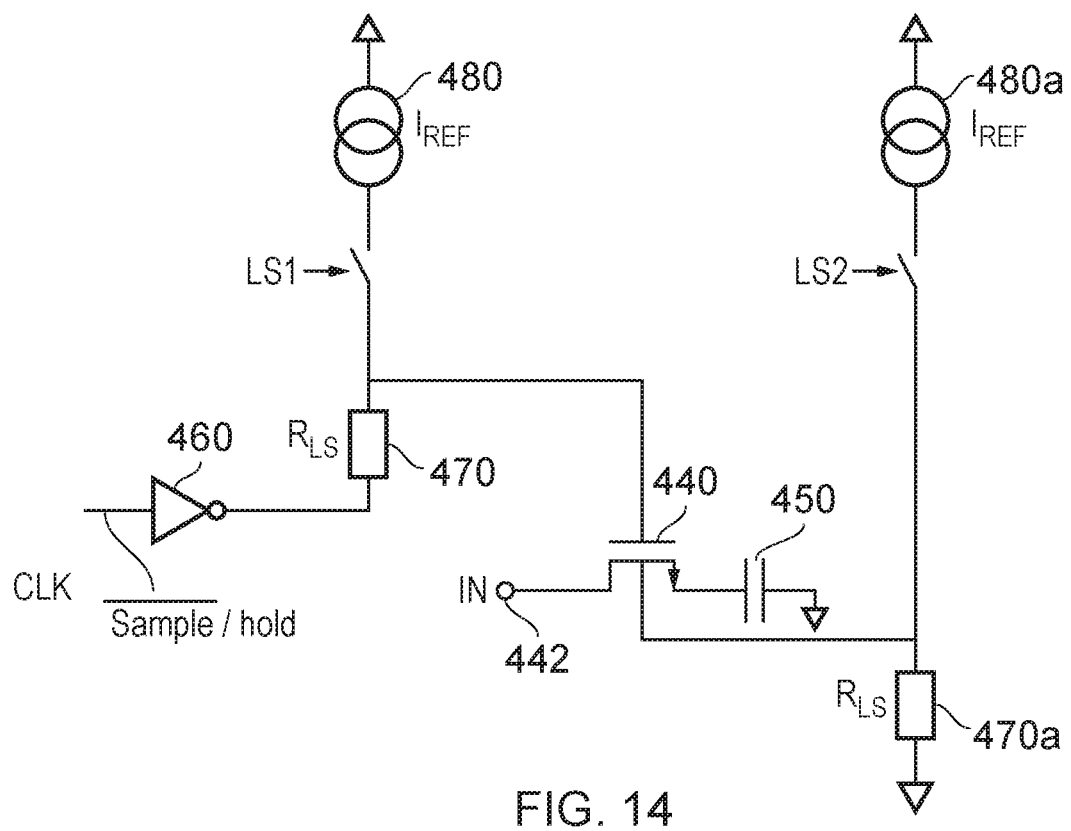
FIG. 14 illustrates an embodiment of a control voltage modification circuit arranged to adapt a gate voltage and a back gate voltage of a switching transistor and constituting an embodiment of this disclosure.

FIG. 14 schematically illustrates an embodiment of a circuit for modifying the digital drive signal voltage applied to a switching transistor as a function of a stimulus voltage of known size applied to a measurement circuit 2. Here a transistor acting as a sampling switch 440 is connected between an input node 442 and a sampling capacitor 450. Other components connected to the sampling capacitor 450 have been omitted for clarity. A gate of the switching transistor 440 receives a control signal from a suitable logic driver 460, such as an inverter 460. The inverter may be responsive to a clock signal (which in this example causes a sample to be taken when the clock is low and a hold to be performed when the clock is high). A resistor 470 having a resistance $R_{LS}$ is connected between the output of the inverter 460 and the gate of the sampling transistor 440. The gate of the sampling transistor is also connected to a current source that sources (or sinks) a current Iref. The current Iref is switchable, in this example by the inclusion of a switch LS1 between the current source 480 and the gate of the sampling transistor 440. The person skilled in the art could use alternative approaches, such as inhibiting the drive to a transistor forming the current source itself or using additional current steering switches. When level shifting switch LS1 is closed, the output voltage of the driver 460 is shifted by a voltage Iref*$R_{LS}$. By suitable selection of one or both of Iref and $R_{LS}$ the voltage shift applied to the gate by actuation of the switch LS1 can be set to match the change in common mode voltage at the input node 442 resulting from the application of the excitation signal by the excitation signal generator 170. Similarly the back gate of the sampling transistor 440 can be driven by a second level shifting circuit comprising a second resistor 470a having value $R_{LS}$ and a second current source 480a selectively supplying a current Iref, for example by way of a second level shifting switch LS2 such that the back gate voltage can be set to 0V or to Iref*$R_{LS}$ volts depending on the status of switch LS2. The switches LS1 and LS2 are driven from the control signal used to instruct the excitation signal to switch to an on state.

Figure 15:
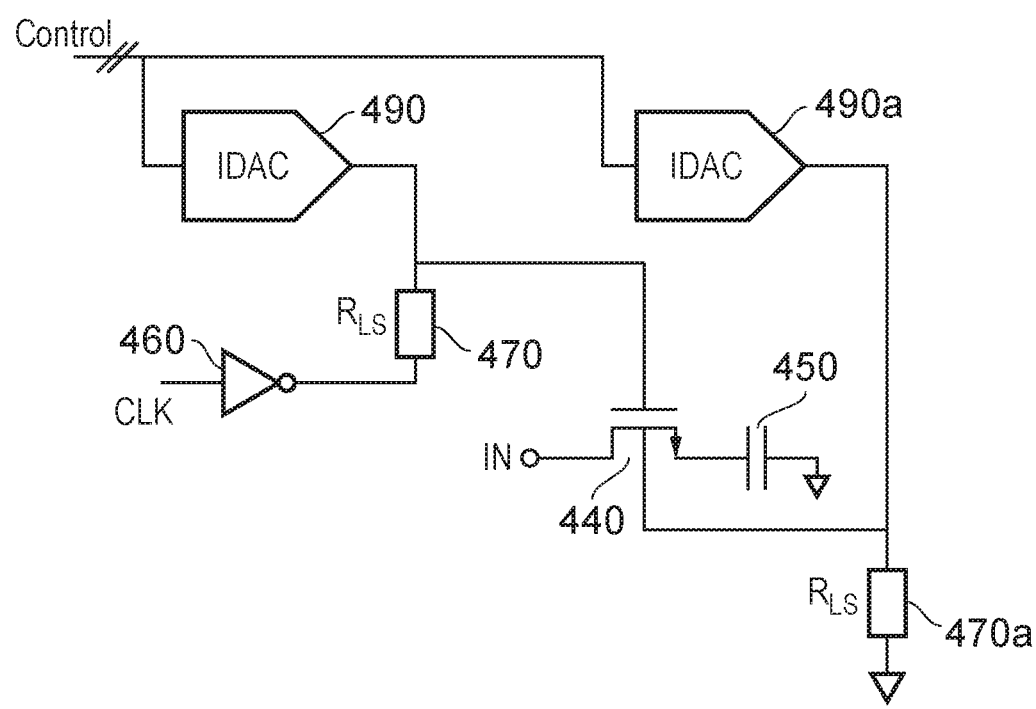
FIG. 15 illustrates an embodiment of a gate voltage modification circuit using current DACs and constituting an embodiment of this disclosure.

If more flexibility is required the fixed current sources sinks 480 and 480a may be replaced by variable current sources. This can be done, as shown in FIG. 15, in a digital domain by replacing the current sources 480 and 480a and optionally their associated switches by current digital to analog converters 490 and 490a, respectively, which are driven by multibit control words. The words may be derived from the correction signal generator. The correction signal generator may include its own ADC so as to estimate the near instantaneous value of the excitation signal or of the common mode voltage change resulting from application of the excitation signal.

Figure 16:
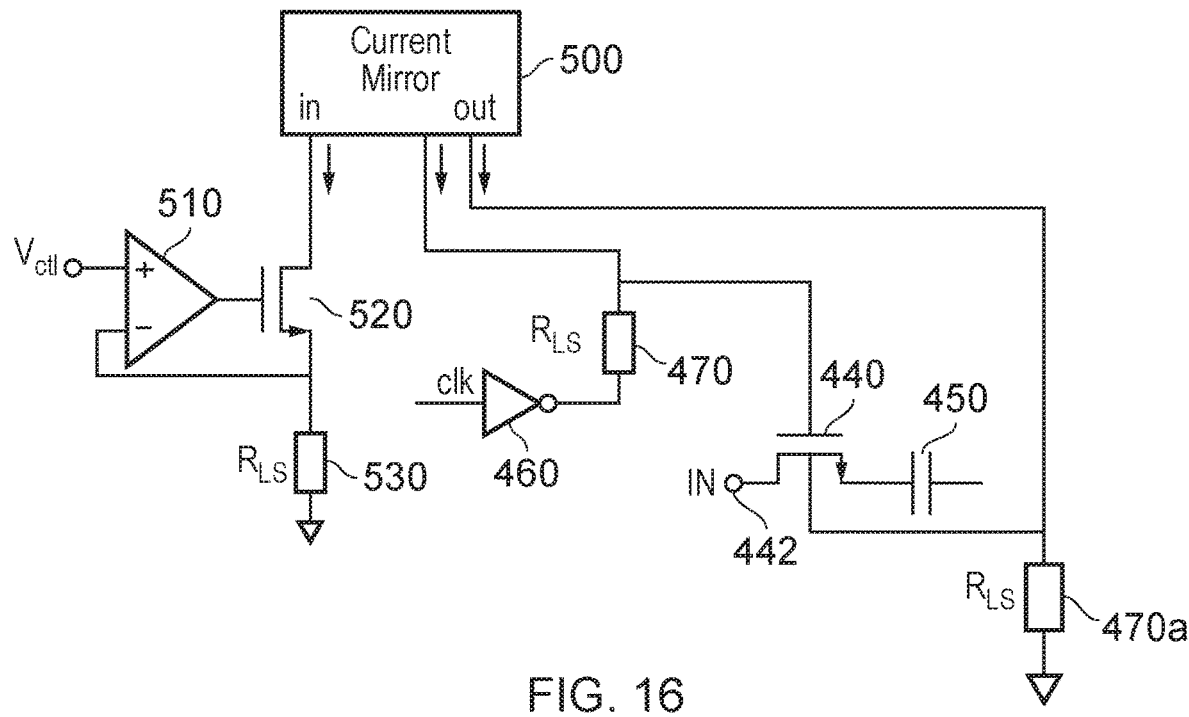
FIG. 16 further illustrates an embodiment of a gate voltage modification circuit constituting an embodiment of this disclosure.
Figure 17:
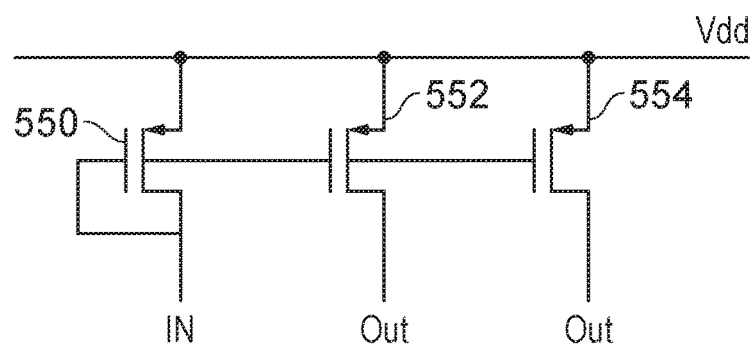
FIG. 17 shows the circuit diagram of the current mirror shown in FIG. 16.

The drive signal correction may also be done in the analog domain. FIG. 16 shows a circuit where the current sources 480 and 480a are replaced with slave stages of a current mirror 500 and the excitation voltage is monitored and used to set the current flowing in the current mirror 500. In the illustrated example embodiment the excitation voltage from the stimulus generator 170 (FIGS. 7 to 9) is supplied to the non-inverting input of an operational amplifier 510 having its output connected to the gate of an n type FET 520. A source of the FET 520 is connected to a load resistor 530 which is connected to ground. The voltage across the resistor is sensed at the inverting input of the amplifier 510. The feedback loop around the amplifier causes the voltage across the resistor to match the voltage at the non-inverting input of the amplifier 510, i.e. the excitation voltage in this example. This voltage is converted into a current by the resistor 530 and the current flowing in the resistor 530 is mirrored by the current mirror to the resistors 470 and 470a. For completeness a possible implementation of the current mirror is shown in FIG. 17 based on p-type MOSFETS with a master transistor 550 being diode connected and connected to the source of the transistor 520 of FIG. 16, and slave transistors 552 and 554 are connected to the gate of the master transistor, as known to the person skilled in the art.

Figure 18:
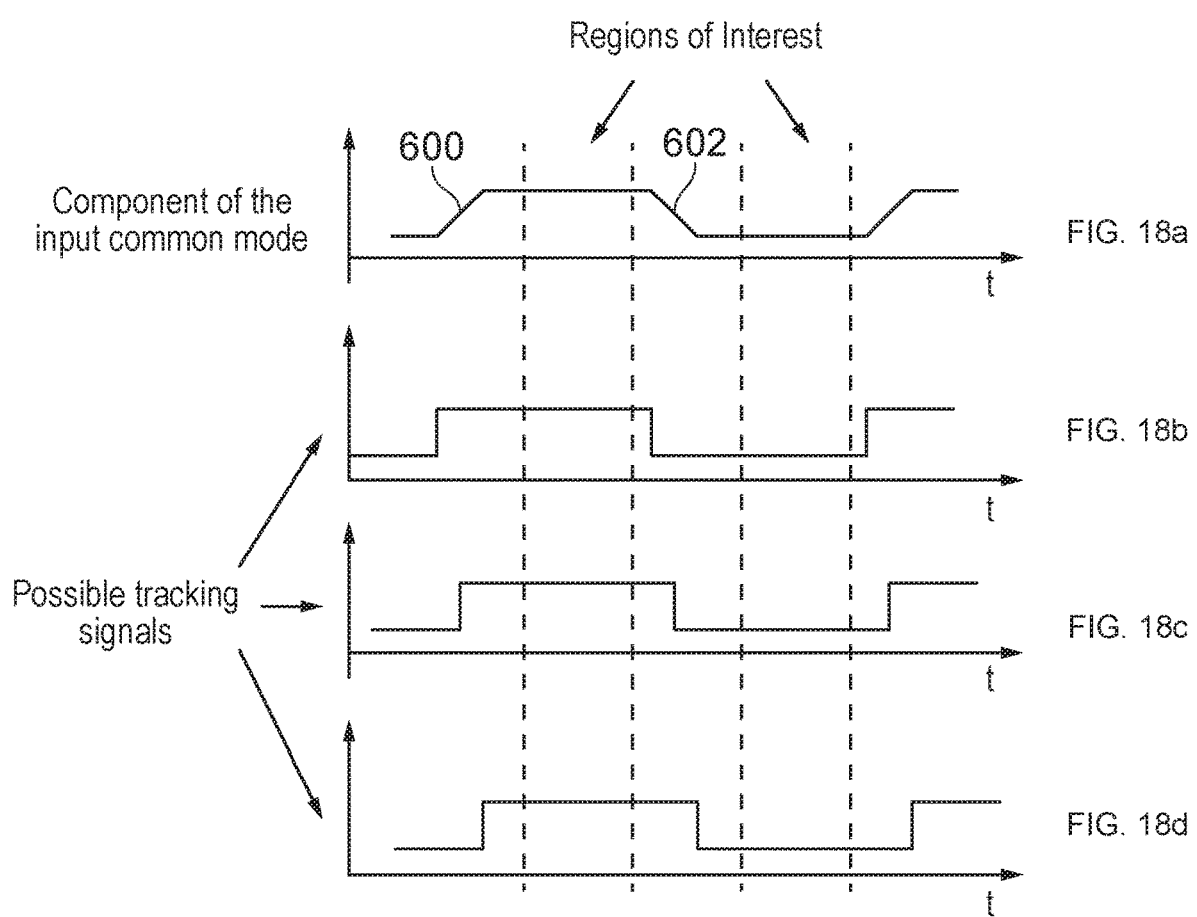
FIGS. 18a, 18b, 18c and 18d are timing diagrams illustrating that the common mode correction does not need to be applied continuously.

FIG. 18a illustrates that the common mode voltage may transition over periods 600 and 602 and that the transitions need not be instantaneous. This may be the result of not seeking to output a square wave from the excitation generator, for example to avoid the harmonic components associated with square waves or because it is cheaper and/or easier to allow the transition to be RC or slew rate limited. However it can be seen that the common mode offset correction need not be correct all of the time. It only needs to be achieved during regions of interest, for example when the sample switches of the processing circuits are closed (sampling the input signal). The timing of the correction signals supplied to the gate and back gate of the sampling transistors can be quite flexible. FIGS. 18b, 18c and 18d all show possible valid correction signals.

Figure 19:
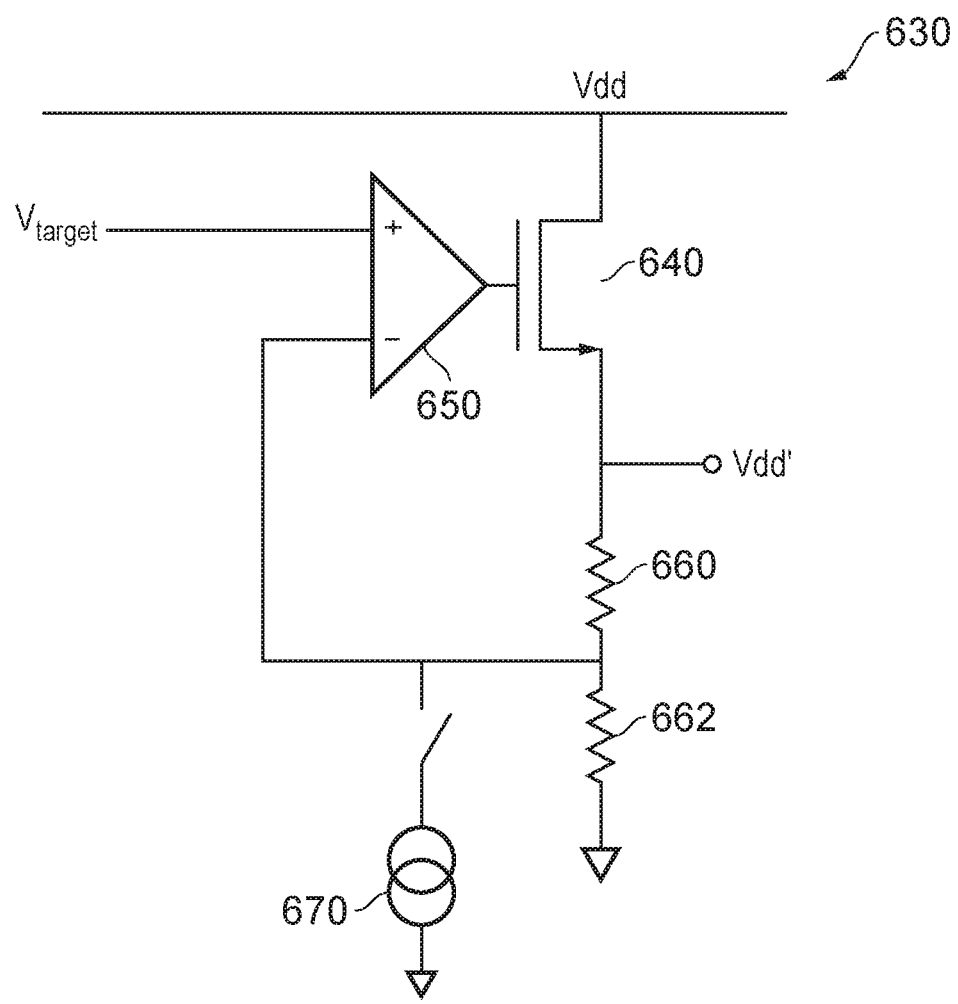
FIG. 19 illustrates an embodiment of a low drop out voltage regulator having an adjustable output voltage in response to a control signal indicating that a common mode offset correction is required.

As noted in FIGS. 7 and 11, it is contemplated that the supply voltage to a signal processing component may be modified as a function of the excitation signal and the resulting action of the measurement circuit. FIG. 19 shows an implementation of a linear voltage regulator 630 that may be used to control Vdd'. The regulator comprises an N type FET, here MOSFET 640 with its drain connected to the supply rail Vdd and its source outputting the modified voltage Vdd'. The MOSFET 640 is included within the feedback loop of operational amplifier 630 which has its inverting input connected to the source of MOSFET 640 by way of a potential divider comprising resistors 660 and 662, and its non-inverting input receiving the target voltage "Vtarget" which matches the desired Vdd' as divided down by the potential divider. When it is desired to modify the output voltage Vdd' a current may be sunk by a current source 670 causing an additional voltage drop to occur across the resistor 660, which causes the feedback loop to increase Vdd'. This approach allows the size of the offset to be controlled by the size of the current sunk and/or by the value of the resistor 660. The current source 670 may be replaced by a current DAC A similar circuit can be used to control Vss' but would naturally involve a P type FET.

Figure 20:
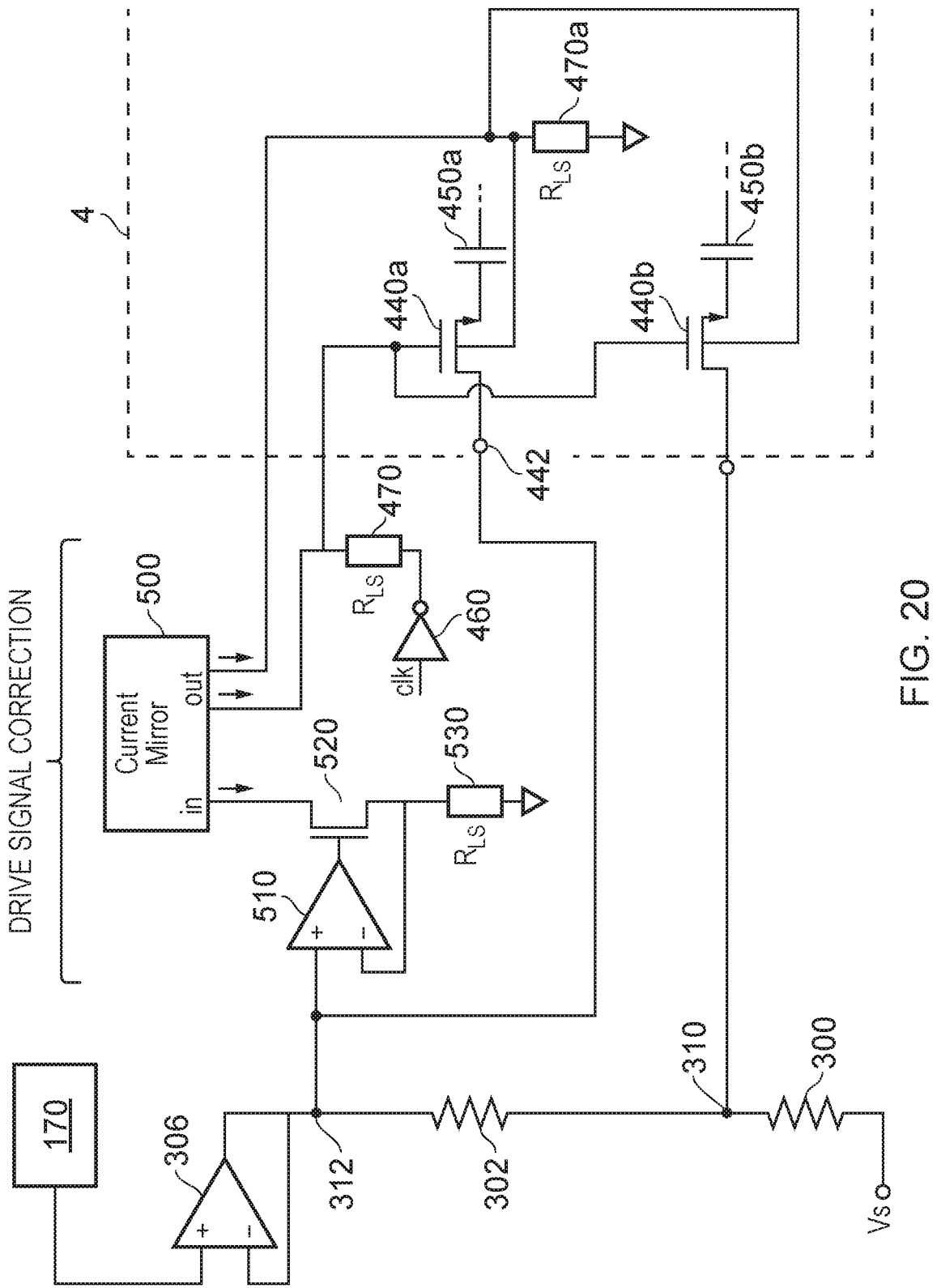
FIG. 20 schematically illustrates a voltage measuring circuit constituting an embodiment of the present disclosure comprising a potential divider, a stimulation signal generator, and circuit for adjusting the gate and back gate voltages of transistor switches within a differential signal processing circuit.

FIG. 20 shows a circuit arrangement like that described with respect to FIG. 16 connected to a potential divider and a stimulus generator 170 as was described with respect to FIG. 12. Like reference numbers are used to describe like parts from those Figures. It can be seen that the drive signal correction for adjusting the voltage of the digital drive signal CLK to track with the changes in the common mode voltage of the differential signal can be achieved by connecting the non-inverting input of the operational amplifier 510 to receive the stimulation signal from the stimulus generator 170. This is achieved in this example by connecting the amplifier to node 312. The voltage differences developed by the currents from the current mirror 500 flowing through the resistors 470 and 470a are provided to the gates and back gates, respectively, of transistors 440a and 440b acting as sampling switches within the differential signal processing circuit 4. Only the very front end of the differential signal processing circuit is illustrated. The differential inputs of the differential signal processing circuit 4 are connected to nodes 310 and 312 either side of resistor 302.

Figure 21:
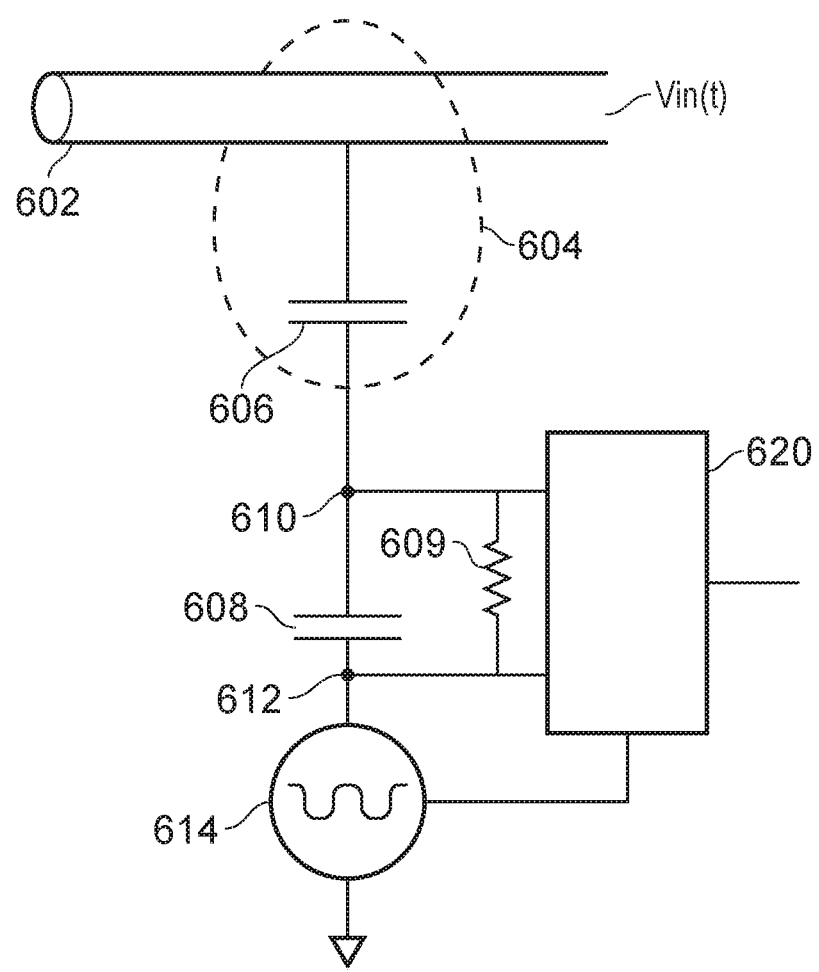
FIG. 21 schematically illustrates a voltage measuring arrangement in accordance with the teachings of the present disclosure.

The present teachings can be used, for example, to improve the operation of non-contacting voltage sensors. FIG. 21 schematically shows an arrangement in which a conductor 602 has the time varying voltage $V_{in}(t)$ which we desire to measure. The voltage $V_{in}(t)$ may be exceptionally high, and therefore galvanic connection to the conductor may be highly undesirable. In order to avoid making a galvanic connection to the conductor non-contacting or galvanically isolated approaches can be adopted. Thus a mechanical clamp, a hook, an open jaw or similar structure can be provided to facilitate removable introduction of a voltage probe to a conductor. Alternatively more permanent structures such as rings or plates can be placed or otherwise fixed around or in close proximity to the conductor. Typically the conductor has an insulation layer, but the clamp, hook, jaw, ring or so on may be associated with an insulator such that it can be used with non-insulated conductors or other arrangements, such as spacing arrangements, can be used to hold a plate or electrode of the sensing arrangement adjacent but spaced from the conductor. Thus the clamp, hook, jaw, ring or so on forms a capacitor coupled with the conductor 602.

In FIG. 21 the probe is designated by the chain line 604 and the capacitor formed by the interaction between the conductors of the probe 604 and the voltage carrying conductor 602 is designated 606. The capacitor 606 is of an unknown value. In the circuit shown in FIG. 21 the unknown capacitor 606 is formed in series with a measurement capacitor 608. A first node 610 is formed between the unknown capacitor 606 and the measurement capacitor 608 and is connected to a first input of a measurement circuit 620. A second node 612 is formed between a second plate of the measurement capacitor 608 and a reference voltage generator 614. The node 612 is connected to a further input of the measurement circuit 620. The measurement circuit is also connected to the voltage generator 614 for example to control the operation of the voltage generator 614.

The first node 610 is generally associated with some means of controlling or restoring a DC voltage across the second capacitor 608. Various approaches could be adopted. In a first approach a resistor 609 may be placed in parallel with capacitor 608 to provide a DC discharge path. In other approaches a high impedance path to a bias voltage may be provided to place a known DC voltage at node 610 and hence on the capacitor 608. This approach can help simplify the design of the input stage of the measurement circuit by enabling the voltage at node 610 to be set to a value that simplifies the biasing of an input transistor of the input stage. Similarly the voltage generator 614 can provide a DC component to node 612 to simplify the design of the input stage.

In use, the voltage generator 614 is used to create a relatively small perturbation to the voltage at node 612. Furthermore this perturbation is generally at a frequency different to the frequency of the input signal $V_{in}(t)$.

Figure 22:
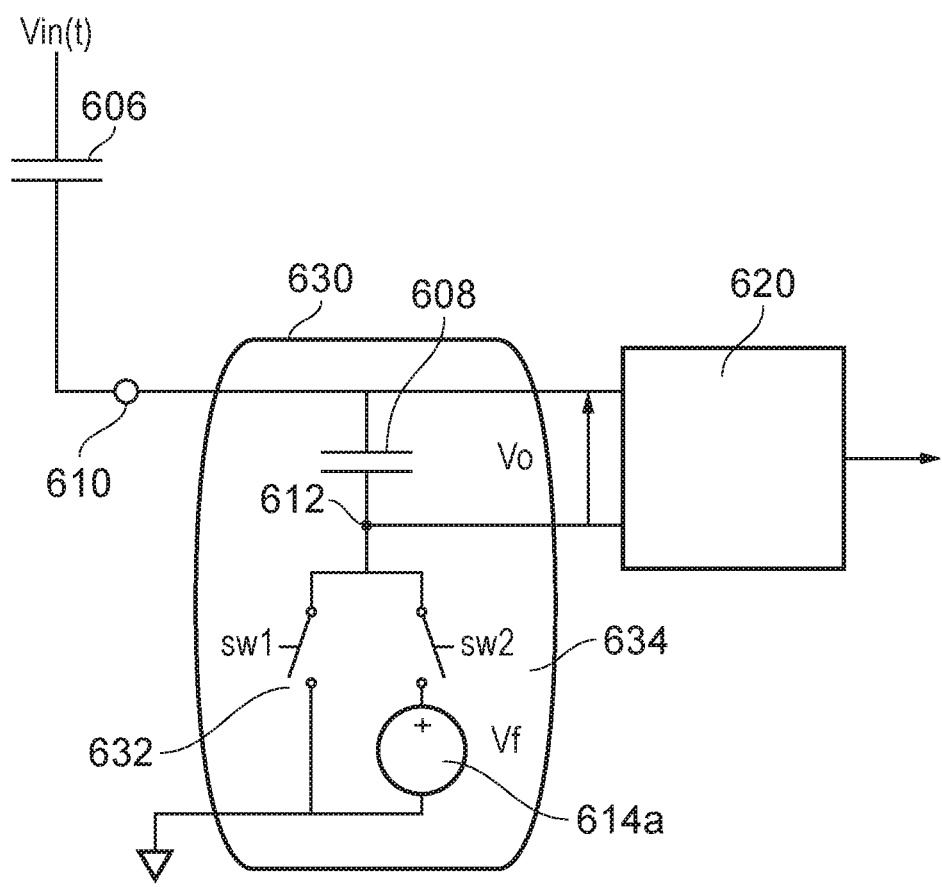
FIG. 22 schematically illustrates a second voltage measuring arrangement in accordance with the teachings of the present disclosure.

FIG. 22 shows an embodiment of an arrangement of FIG. 21 in greater detail.

In FIG. 22 the measurement capacitor 608 and the voltage generator 614 are illustrated as being within an input circuit 630. The signal generator is formed as a combination of a first switch 632 extending between the second node 612 and ground, and a second switch 634 which extends between the second node 612 and a DC voltage reference 614a providing a fixed output voltage Vf. The switches 632 and 634 are energized by signals sw1 and sw2 from the switch controller (not shown).

Figure 23:
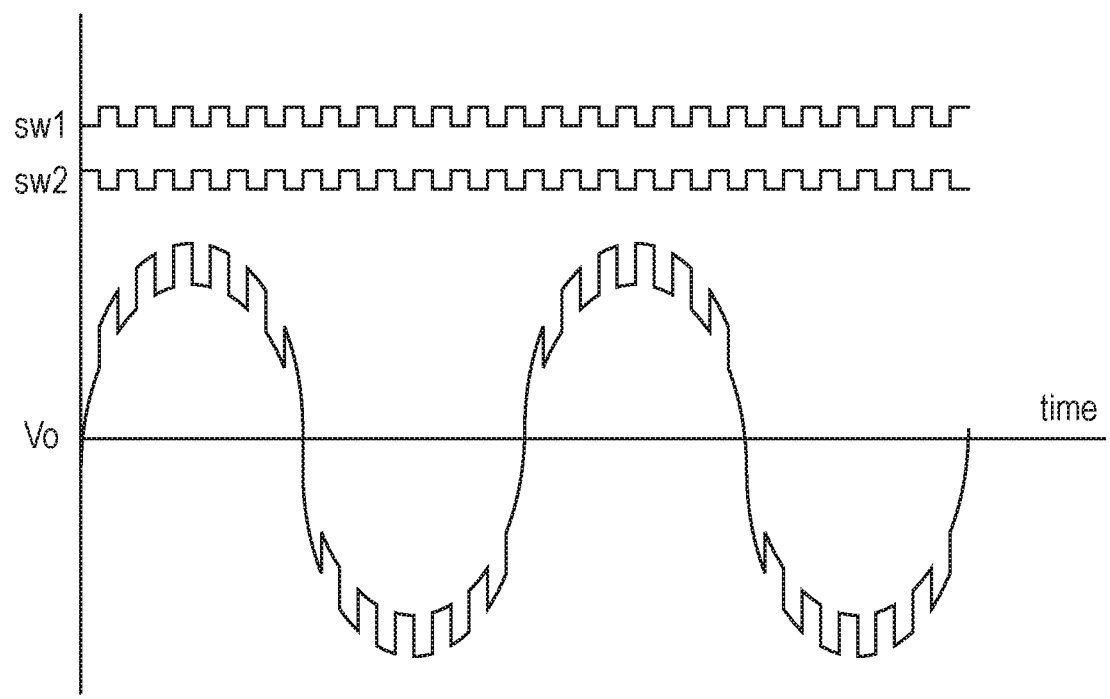
FIG. 23 schematically illustrates operation of the switches in FIG. 22 to modulate the voltage Vo across the measurement capacitor.

FIG. 23 shows the switch control signals sw1 and sw2 and the fact that they are driven in antiphase. FIG. 23 also shows how operation of the switches effects the output voltage Vo developed between nodes 610 and 612.

The capacitors 606 and 608 form a capacitive divider and consequently, if the conductor 602 is carrying a mains electricity signal, then the output voltage Vo corresponds to a divided down version of that mains signal. The divide ratio depends on the relative sizes of the known capacitor 608 and the unknown capacitor 606.

Applying a perturbation to the node 612 causes that perturbing voltage to modify the operation of the potential divider. This is described in more detail in WO2014/072733, but one way of looking at this is to consider that the voltage difference across the divider gets reduced or increased depending on the size and magnitude of the modulation. Additionally, the perturbation signal also gets divided by the operation of the potential divider. From this it becomes apparent that having knowledge of the input perturbation, and monitoring the output perturbation enables the divide ratio of the potential divider to be estimated. Once the divide ratio is known, then this can be applied to the voltage Vo across the measurement capacitor 608 to estimate the input voltage $V_{in}(t)$.

Figure 24:
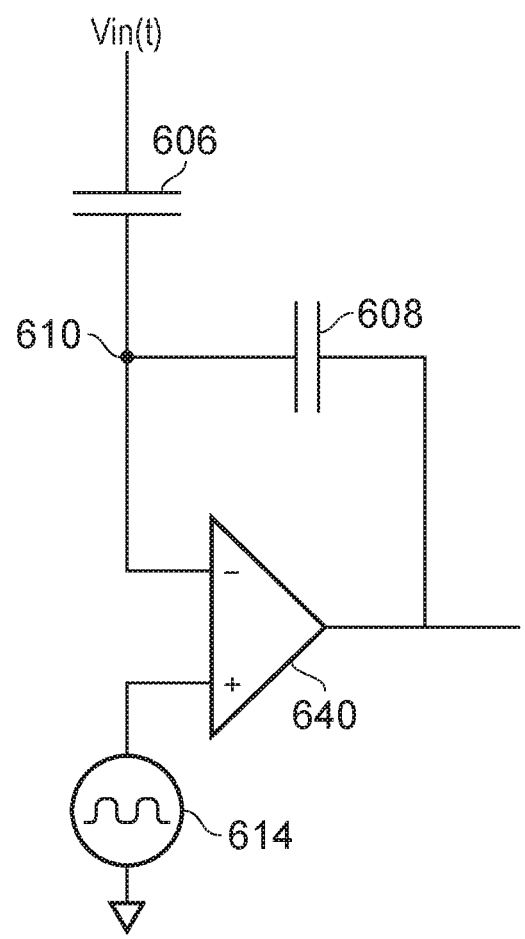
FIG. 24 schematically illustrates a modification to the input circuit using a virtual earth configuration.

Other measurement configurations of the input stage are possible. Thus, as shown in FIG. 24, the unknown capacitor 606 and the feedback capacitor 608 can be arranged around an operational amplifier 640 in a virtual earth configuration. Again steps can be taken to restore node 610 to a desired DC value, for example by placing resistor 609 (not shown) in parallel with capacitor 608. This approach facilitates DC restoration and also provides protection against leakage currents being integrated onto capacitor 608 and eventually driving the amplifier 640 into saturation.

Figure 25:
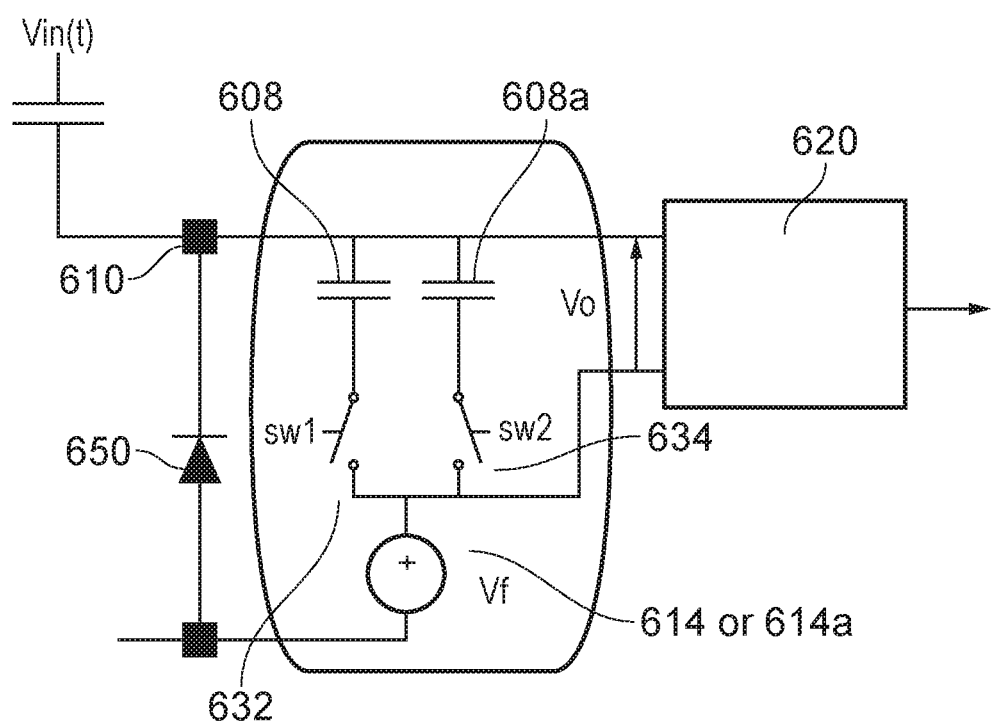
FIG. 25 is a circuit diagram of a further embodiment of the present disclosure.

Modifying the voltage at one plate of the measurement capacitor is a particularly convenient way of perturbing the operation of the capacitive potential divider, but it is not the only one. FIG. 25 illustrates a further embodiment where the capacitance of the measurement capacitor 608 can be varied, for example by using the switches 632 and 634 to switch between two measurement capacitors or to bring a further capacitor in parallel with the measurement capacitor. In the arrangement shown in FIG. 25 a further capacitor 608a is provided in parallel with the measurement capacitor 608 such that they can be swapped in and out of the potential divider. The switches 632 and 634 may connect directly to ground or they may connect via a voltage source 614 or 614a. If a fixed voltage source 614a is used, then a voltage offset may make the design of the input stage of the data processing apparatus 620 easier. However, it can also be seen that a modulated voltage could also be provided thereby allowing additional degrees of freedom in seeking to characterize the transfer function of the potential divider formed between the capacitors 608 and the unknown capacitor 606.

Additionally, as shown in FIG. 25 a protection arrangement, such as a voltage clamping diode 650 may be provided between node 610 and ground in order to protect the electronics of the measurement circuit.

The data processor may output a digital code directly representative of the voltage $V_{in}(t)$ or might simply provide an indication of the transfer function of the potential divider network.

It is thus possible to provide an improved non-galvanically connected voltage measuring circuit. The use of voltage modification to the control signals driving the switches of the input stage or of the supply rails at a front end of the input stage significantly improves common mode rejection in this technically demanding use case.

In some embodiments there is provided a non-contacting voltage measurement apparatus, in which the reference signal generator generates a signal of amplitude less than 30 V peak to peak.

In some embodiments there is provided a non-contacting voltage measurement apparatus in which the reference signal generator generates a reference signal of less than 10 V peak to peak.

In some embodiments there is provided a non-contacting voltage measurement apparatus further comprising a signal processing apparatus for receiving the voltage across the measurement capacitor and the reference signal, and estimating a transfer function of the potential divider and/or the voltage of the conductor.

In some embodiments there is provided a non-contacting voltage measurement apparatus in which the signal processing apparatus is based on the teachings of WO2014/072733 or WO2013/038176 where a small perturbing signal is used with a divider network to characterize the transfer function of the divider network.

It is thus possible to reduce non-linearites in differential circuits resulting for non-ideal characteristics of transistors used as switches. The steps disclosed herein can be used in conjunction with known techniques for reducing charge injection as the transistors are switched. Alternatively the voltage variation of the supply, gate or back-gate voltages can be modified to mitigate the effects of charge injection as well as common mode voltage variation.

Although the disclosure has focused on changes in input values occurring across Wheatstone bridges and potential dividers, the invention described herein is not limited to these uses. The inputs may originate from a variety of transducers, such as a current shunt such that the voltage across the shunt is representative of the current in the shunt, as might be found in a RF amplifier gain control circuit. The differential signal processing circuit may be used in industrial control, instrumentation or power metering applications. Alternatively the voltage may derive from a component in an attenuator circuit.

The claims presented herein have been written in single dependency format suitable for presentation at the USPTO. However for the avoidance of doubt each claim may depend on any preceding claim of the same type unless such a dependency is clearly not technically possible.

The invention claimed is:

1. An apparatus comprising:
an active circuit that is configured to:
determine an adjustment to a control voltage of a differential signal processing circuit by using an indication of a time varying perturbation of a common mode voltage of a differential pair of signals determined by a first circuit and, processed by the differential signal processing circuit to estimate the common mode voltage generated using the differential pair of signals; and
adjust the control voltage of the differential signal processing circuit based on a stimulation signal being applied to the first circuit.

2. An apparatus as claimed in claim 1, wherein the differential signal processing circuit comprises at least one transistor switch that is configured to receive at least one signal of the differential pair of signals, and to adjust the control voltage of the differential signal processing circuit, the active circuit being configured to adjust a control voltage of the at least one transistor switch.

3. An apparatus as claimed in claim 2, wherein the apparatus is configured to:
monitor an output of an excitation circuit that is configured to apply the stimulation signal; and
adjust the control voltage of the at least one transistor switch in response to the output of the excitation circuit.

4. An apparatus as claimed in claim 2 in which the apparatus monitors a control signal supplied to an excitation circuit applying the stimulation signal and varies a gate voltage of the at least one transistor switch in response to the control signal.

5. An apparatus as claimed in claim 2, wherein to adjust the control voltage of the differential signal processing circuit, the active circuit is configured to adjust the control voltage of the at least one transistor switch responsive to a perturbation of the common mode voltage resulting from the stimulation signal.

6. An apparatus as claimed in claim 5, wherein to adjust the control voltage of the differential signalprocessing circuit, the active circuit is configured to adjust the control voltage of the at least one transistor switch responsive to a change in the common mode voltage resulting from a change in the stimulation signal.

7. An apparatus as claimed in claim 2, further comprising a sampling circuit, the sampling circuit comprising the at least one transistor switch.

8. An apparatus as claimed in claim 7, wherein the sampling circuit further comprises an amplifier, an integrator, or an analog to digital converter.

9. An apparatus as claimed in claim 7, further comprising:
a stimulus generator for providing the stimulation signal to the first circuit, wherein the stimulus generator is coupled to the differential signal processing circuit to cause the stimulation signal to modify differential and common mode voltages at inputs of the differential signal processing circuit.

10. An apparatus as claimed in claim 9, wherein the first circuit includes a voltage divider having a first input node, a second input node and an output node, wherein the first input node is configured to receive a voltage to be attenuated and processed, the second input node is configured to receive the stimulation signal, and a first input of the differential signal processing circuit is coupled to the output node and a second input of the differential signal processing circuit is coupled to the second input node or to a second output.

11. An apparatus as claimed in claim 9, further comprising a correction signal generator responsive to the stimulus generator for generating a correction signal for controlling the adjustment of the control voltage of the differential signal processing circuit.

12. An apparatus as claimed in claim 2, wherein the active circuit is configured to apply the adjustment to the control voltage by applying a modulation or a voltage translation to a digital switch driving signal that is configured to drive the at least one transistor switch.

13. An apparatus as claimed in claim 1, wherein the active circuit is configured to adjust the control voltage of the differential signal processing circuit based on a magnitude or a timing parameter of the stimulation signal.

14. An apparatus as claimed in claim 1, wherein a magnitude of the stimulation signal is known or measured to sufficient accuracy to enable a response of the first circuit and a response of the differential signal processing circuit to be characterized to a desired accuracy as a result of a change made to the stimulation signal.

15. An apparatus as claimed in claim 1, included in a voltage measurement circuit, an electricity meter, or a power measurement apparatus.

16. An apparatus as claimed in claim 1, wherein to adjust the control voltage of the differential signal processing circuit, the active circuit is configured to adjust supply voltage of the differential signal processing circuit.

17. An apparatus as claimed in claim 1, further comprising a correction signal generator responsive to a stimulus generator for generating a correction signal for controlling adjustment of a supply voltage of the differential signal processing circuit.

18. An apparatus as claimed in claim 1, wherein to adjust a supply voltage of the differential signal processing circuit, the active circuit is configured to adjust a voltage applied to a back-gate node of an at least one transistor switch of the differential signal processing circuit.

19. An apparatus comprising:
 a differential signal processing circuit and a stimulus signal generator, wherein the stimulus signal generator is arranged to apply a stimulation signal to an input circuit that is arranged to supply first and second signals that together form a differential signal to signal inputs of the differential signal processing circuit;
 a correction signal generator circuit to receive the stimulation signal and generate a correction signal based on an estimated change in a common mode voltage developed between the inputs of the differential signal processing circuit responsive to the stimulation signal, the correction signal generator circuit configured to determine the estimated change using an indication of a time varying perturbation of a common mode voltage in the stimulation signal; and
 a further circuit that is configured to adjust a resistance of a transistor switch of the differential signal processing circuit to offset a change in the resistance of the transistor switch caused by the stimulation signal.

20. An apparatus as claimed in claim 19, wherein the differential signal processing circuit comprises a switched capacitor analog to digital converter circuit comprising the transistor switch, and to adjust the resistance of the transistor switch, the further circuit is configured to modify first and second supply voltages of the switched capacitor analog to digital converter circuit responsive to the correction signal.

21. An apparatus as claimed in claim 19, wherein to adjust the resistance of the transistor switch, the further circuit is configured to adjust a control voltage that is configured to control the transistor switch.

22. An apparatus as claimed in claim 19, wherein to adjust the resistance of the transistor switch, the further circuit is configured to adjust a reference voltage or a signal ground voltage of the differential signal processing circuit.

23. A method of improving a common mode rejection ratio of a differential circuit, the method comprising:
 generating a correction signal based on an estimated change in a common mode voltage of a pair of differential input signals of a differential circuit responsive to a stimulation signal; and
 adjusting operation of a field effect transistor responsive to the correction signal, the field effect transistor being configured as a switch for sampling an input of the differential circuit.

24. A method as claimed in claim 23, further comprising adjusting the operation of the field effect transistor responsive to the correction signal by adjusting at least one of first and second supply voltages of the differential circuit or a digital control signal applied to a gate node of the field effect transistor.

25. A method as claimed in claim 24, further comprising determining the estimated change in a common mode voltage by using information that is indicative of a time varying characteristic of a perturbation of the common mode voltage to estimate the common mode voltage.

26. A method as claimed in claim 23, further comprising providing a known perturbation to a circuit providing a differential input to the differential circuit, the known perturbation configured to at least partially generate the common mode voltage.

* * * * *

UNITED STATES PATENT AND TRADEMARK OFFICE
CERTIFICATE OF CORRECTION

PATENT NO. : 10,892,722 B2
APPLICATION NO. : 16/015657
DATED : January 12, 2021
INVENTOR(S) : Hurwitz et al.

Page 1 of 1

It is certified that error appears in the above-identified patent and that said Letters Patent is hereby corrected as shown below:

On the Title Page

In item (60), in "Related U.S. Application Data", in Column 1, Line 2, after "2017.", insert a line break and --(30) Foreign Application Priority Data
Sep. 08, 2017 (GB) 1801910.9--

In the Claims

In Column 18, Line 19, in Claim 6, delete "signalprocessing" and insert --signal processing-- therefor Signed and Sealed this
Eighteenth Day of May, 2021

Drew Hirshfeld
*Performing the Functions and Duties of the*
*Under Secretary of Commerce for Intellectual Property and*
*Director of the United States Patent and Trademark Office*